US010134613B2

(12) United States Patent
Qiao et al.

(10) Patent No.: US 10,134,613 B2
(45) Date of Patent: Nov. 20, 2018

(54) CLUSTER TOOL APPARATUS AND A METHOD OF CONTROLLING A CLUSTER TOOL APPARATUS

(71) Applicant: Macau University of Science and Technology, Taipa (MO)

(72) Inventors: Yan Qiao, Taipa (MO); Mengchu Zhou, Taipa (MO); Naiqi Wu, Taipa (MO); Zhiwu Li, Taipa (MO); Qinghua Zhu, Taipa (MO)

(73) Assignee: MACAU UNIVERSITY OF SCIENCE AND TECHNOLOGY, Taipa (MO)

( * ) Notice: Subject to any disclaimer, the term of this patent is extended or adjusted under 35 U.S.C. 154(b) by 108 days.

(21) Appl. No.: 15/272,706

(22) Filed: Sep. 22, 2016

(65) Prior Publication Data

US 2018/0082878 A1      Mar. 22, 2018

(51) Int. Cl.
*H01L 21/677* (2006.01)
*H01L 21/67* (2006.01)

(52) U.S. Cl.
CPC ...... *H01L 21/67167* (2013.01); *H01L 21/677* (2013.01); *H01L 21/67745* (2013.01)

(58) Field of Classification Search
CPC ........... G05B 2219/45031; G05B 2219/32245; G05B 2219/32267; G05B 2219/45032;
(Continued)

(56) References Cited

U.S. PATENT DOCUMENTS 5,928,389 A * 7/1999 Jevtic ............... G05B 19/41865
29/25.01
6,418,350 B1 * 7/2002 Hamidzadeh .... G05B 19/41865
700/100
(Continued)

OTHER PUBLICATIONS

W. K. V. Chan, J. Yi, and S. Ding, "Optimal Scheduling of Multicluster Tools with Constant Robot Moving Times, Part I: Two-Cluster Analysis", IEEE Transactions on Automation Science and Engineering, vol. 8, No. 1, Jan. 2011, pp. 5-16.
(Continued)

*Primary Examiner* — Ryan Rink
(74) *Attorney, Agent, or Firm* — Renner Kenner Greive Bobak Taylor & Weber

(57) ABSTRACT

A system and method for a cluster tool apparatus for processing a semiconductor product including processing modules located adjacent each other and configured to process a semiconductor module, loadlocks configured to retain and dispense unprocessed semiconductor products and each positioned adjacent one of the processing modules, a robot configured to load, transfer and unload a semiconductor product to and from the processing modules, a hardware controller in communication with the robot and executing a method to close down the cluster tool apparatus to an idle state, the method including determining a status of the processing modules, determining if a close down process is required based on the status or based on a close down signal, and, if required, determining a schedule for a close down process based on a semiconductor product residency parameter, and controlling the operation of the robot based on the schedule to perform the close down process.

17 Claims, 13 Drawing Sheets

(58) Field of Classification Search
CPC .... Y02P 90/20; Y02P 90/86; H01L 21/67184; H01L 21/67276; G06F 17/5013; B25J 9/00

See application file for complete search history.

(56) References Cited

U.S. PATENT DOCUMENTS

| | | | |
|---|---|---|---|
| 7,130,769 B1* | 10/2006 | Allen, Jr. | G05B 23/0235 702/184 |
| 2002/0147960 A1* | 10/2002 | Jevtic | G05B 19/41865 716/50 |
| 2004/0078109 A1* | 4/2004 | Babikian | G05B 19/41865 700/121 |
| 2006/0176928 A1* | 8/2006 | Nakamura | H01L 21/67017 373/60 |
| 2009/0076648 A1* | 3/2009 | Numakura | H01L 21/67276 700/228 |
| 2017/0083009 A1* | 3/2017 | Wu | G05B 19/4187 |
| 2017/0083010 A1* | 3/2017 | Wu | G05B 19/41865 |

OTHER PUBLICATIONS

S. Ding, J. Yi, and M. T. Zhang, "Multicluster Tools Scheduling: An Integrated Event Graph and Network Model Approach", IEEE Transactions on Semiconductor Manufacturing, vol. 19, No. 3, Aug. 2006, pp. 339-351.
J-H. Kim, T-E. Lee, H-Y. Lee, and D-B. Park, "Scheduling Analysis of Time-Constrained Dual-Armed Cluster Tools", IEEE Transactions on Semiconductor Manufacturing, vol. 16, No. 3, Aug. 2003, pp. 521-534.
T-K. Kim, C. Jung, and T-E. Lee, "Scheduling start-up and close-down periods of dual-armed cluster tools with wafer delay regulation", International Journal of Production Research, vol. 50, No. 10, May 2012, pp. 2785-2795.
D-K. Kim, T-E. Lee, and H-J. Kim, "Optimal Scheduling of Transient Cycles for Single-Armed Cluster Tools", Proceedings of 2013 IEEE International Conference on Automation Science and Engineering (CASE), Madison, WI, USA, Aug. 2013, pp. 874-879.
H-J. Kim, J-H. Lee, and T-E. Lee, "Scheduling Cluster Tools with Ready Time Constraints for Consecutive Small Lots", IEEE Transactions on Automation Science and Engineeringf, vol. 10, No. 1, Jan. 2013, pp. 145-159.
H-J. Kim, J-H. Lee, and T-E. Lee, "Noncyclic Scheduling of Cluster Tools with a Branch and Bound Algorithm", IEEE Transactions on Automation Science and Engineering, vol. 12, No. 2, Apr. 2015, pp. 690-700.
J-H. Lee, H-J. Kim, and T-E. Lee, "Scheduling Transient Periods of Dual-Armed Cluster Tools", Proceedings of 2012 IEEE International Conference on Mechatronics and Automation, Aug. 5-8, Chengdu, China, pp. 1569-1574.
J-H. Lee, H-J. Kim, and T-E. Lee, "Scheduling Lot Switching Operations for Cluster Tools", IEEE Transactions on Semiconductor Manufacturing, vol. 26, No. 4, Nov. 2013, pp. 592-601.
T-E. Lee and S-H. Park, "An Extended Event Graph with Negative Places and Tokens for Time Window Constraints", IEEE Transactions on Automation Science and Engineering, vol. 2, No. 4, Oct. 2005, pp. 319-332.
M. J. Lopez and S. C. Wood, "Systems of Multiple Cluster Tools: Configuration, Reliability, and Performance", IEEE Transactions on Semiconductor Manufacturing, vol. 16, No. 2, May 2003, pp. 170-178.

C. R. Pan, Y. Qiao, M. C. Zhou, and N. Q. Wu, "Scheduling and Analysis of Start-Up Transient Processes for Dual-Arm Cluster Tools with Wafer Revisiting" IEEE Transactions on Semiconductor Manufacturing, vol. 28, No. 2, May 2015, pp. 160-170.
T. L. Perkinson, P. K. McLarty, R. S. Gyurcsik, and R. K. Cavin III, "Single-Wafer Cluster Tool Performance: An Analysis of Throughput", IEEE Transactions on Semiconductor Manufacturing, vol. 7, No. 3, Aug. 1994, pp. 369-373.
T. L. Perkinson, R. S. Gyurcsik, and P. K. McLarty, "Single-Wafer Cluster Tool Performance: An Analysis of the Effects of Redundant Chambers and Revisitation Sequences on Throughput", IEEE Transactions on Semiconductor Manufacturing, vol. 9, No. 3, Aug. 1996, pp. 384-400.
Y. Qiao, N. Wu, C. Pan, and M. Zhou, "How to Respond to Process Module Failure in Residency Time-Constrained Single-Arm Cluster Tools" IEEE Transactions on Semiconductor Manufacturing, vol. 27, No. 4, Nov. 2014, pp. 462-474.
Y. Qiao, C-R. Pan, N-Q. Wu, and M. Zhou, "Response Policies to Process Module Failure in Single-Arm Cluster Tools Subject to Wafer Residency Time Constraints", IEEE Transactions on Automation Science and Engineering, vol. 12, No. 3, Jul. 2015, pp. 1125-1139.
S. Rostami, B. Hamidzadeh, and D. Camporese, "An Optimal Periodic Scheduler for Dual-Arm Robots in Cluster Tools with Residency Constraints", IEEE Transactions on Robotics and Automation, vol. 17, No. 5, Oct. 2001, pp. 609-618.
Y-H. Shin, T-E. Lee, J-H. Kim, and H-Y. Lee, "Modeling and implementing a real-time scheduler for dual-armed cluster tools", Computers in Industry, vol. 45, No. 1, 2001, pp. 13-27.
S. Venkatesh, R. Davenport, P. Foxhoven, and J. Nulman, "A Steady-State Throughput Analysis of Cluster Tools: Dual-Blade Versus Single-Blade Robots", IEEE Transactions on Semiconductor Manufacturing, vol. 10, No. 4, Nov. 1997, pp. 418-424.
U. Wikborg and T-E. Lee, "Noncyclic Scheduling for Timed Discrete-Event Systems with Application to Single-Armed Cluster Tools Using Pareto-Optimal Optimization", IEEE Transactions on Automation Science and Engineering, vol. 10, No. 3, Jul. 2013, pp. 699-710.
N. Wu, C. Chu, F. Chu, and M. C. Zhou, "A Petri Net Method for Schedulability and Scheduling Problems in Single-Arm Cluster Tools with Wafer Residency Time Constraints", IEEE Transactions on Semiconductor Manufacturing, vol. 21, No. 2, May 2008, pp. 224-237.
N. Wu and M. Zhou, "A Closed-Form Solution for Schedulability and Optimal Scheduling of Dual-Arm Cluster Tools with Wafer Residency Time Constraint Based on Steady Schedule Analysis", IEEE Transactions on Automation Science and Engineering, vol. 7, No. 2, Apr. 2010, pp. 303-315.
X. Yao, E. Fernandez-Gaucherand, M. C. Fu, and S. I. Marcus, "Optimal Preventative Maintenance Scheduling in Semiconductor Manufacturing", IEEE Transactions on Semiconductor Manufacturing, vol. 17, No. 3, Aug. 2003, pp. 345-356.
J. Yi, S. Ding, D. Song, and M. T. Zhang, "Steady-State Throughput and Scheduling Analysis of Multicluster Tools: A Decomposition Approach", IEEE Transactions on Automation Science and Engineering, vol. 5, No. 2, Apr. 2008, pp. 321-336.
H. J. Yoon and D. Y. Lee, "Online Scheduling of Integrated Single-Wafer Processing Tools with Temporal Constraints", IEEE Transactions on Semiconductor Manufacturing, vol. 18, No. 4, Nov. 2005, pp. 390-398.
W. M. Zuberek, "Timed Petri Nets in Modeling and Analysis of Cluster Tools", IEEE Transactions on Robotics and Automation, vol. 17, No. 5, Oct. 2001, pp. 562-575.

* cited by examiner

| Symbols | Actions | Time Durations |
|---|---|---|
| $L_i$ | Robot loads a wafer into $PM_i$, $i \in \Omega_n$ | $\alpha$ |
| $U_i$ | Robot unloads a wafer from $PM_i$, $i \in N_n$ | $\alpha$ |
| $U_0$ | Robot unloads a wafer from a loadlock and aligns it | $\alpha_0$ |
| $m_{ij}$ | Robot moves from $PM_i$ to $PM_j$ | $\mu$ |
| $\tau_i$ | The wafer sojourn time in $PM_i$, $i \in N_n$ | $\tau_i \in [a_i, a_i + \delta_i]$ |
| $w_i$ | The robot waiting before unloading a wafer from $PM_i$, $i \in \Omega_n$ | $\varpi_i \in [0, \infty]$ |

Fig. 4

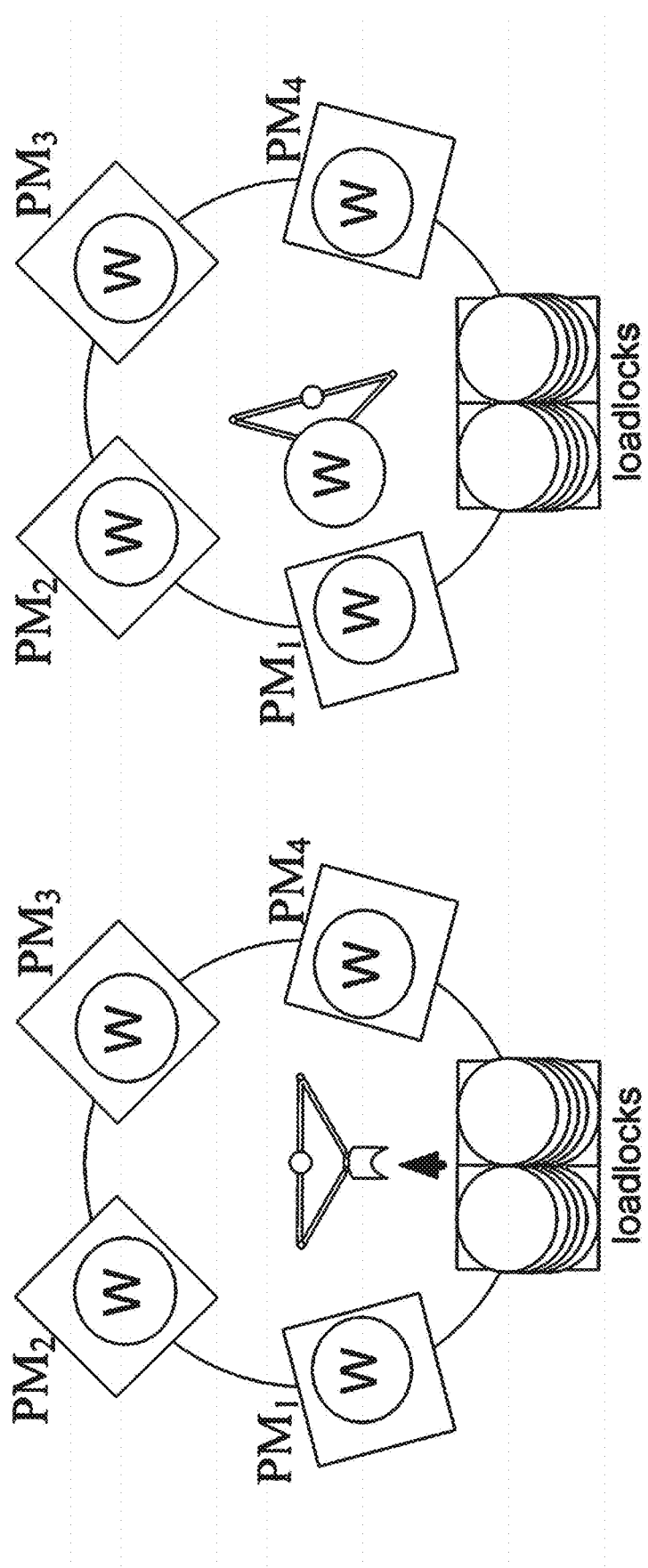

CLUSTER TOOL APPARATUS AND A METHOD OF CONTROLLING A CLUSTER TOOL APPARATUS

TECHNICAL FIELD

The present disclosure relates to a cluster tool apparatus and a method of controlling the cluster tool apparatus, in particular, but not limited to, a cluster tool apparatus comprising a plurality of processing modules and a method of controlling the cluster tool apparatus to close down a cluster tool apparatus to an idle state.

BACKGROUND

Semiconductors are ubiquitous in modern society and used in a wider range of uses. Some examples are modern electronic components such as diodes, transistors, etc. The pure silicon is used to create wafers or substrates that can be used in electronics for fabrication of integrated circuits or printed circuit boards or photovoltaic cells. Wafer fabrication processes are carefully controlled and managed processes.

A semiconductor fabrication plant has many cluster tool. Cluster tool apparatuses are a type of integrated equipment that are used in semiconductor processing methods, in particular cluster tools are used in wafer processing. Cluster tools are used in the wafer manufacturing process. Cluster tools are used to process wafers by using a predetermined recipe or process. Cluster tools provide a flexible reconfigurable, and efficient environment, resulting in higher productivity while resulting in shorter cycle times.

At times, a cluster tool apparatus may be required to be closed down or shut down to an idle state. In this idle state the cluster tool apparatus is incapable of processing wafers. One common reason to close down or shut down a cluster tool apparatus is for maintenance work. Cluster tools require regular maintenance to ensure optimal performance, longevity of the cluster tool apparatus and ensure yielding of high quality wafers. Cluster tool apparatuses may also experience a failure from time to time. If the cluster tool apparatus or a component thereof fails for any reason, the entire cluster tool apparatus is required to be shut down to an idle state.

It is of economic interest and importance for a plant to have an efficient close down process or method to ensure that productivity and quality are not compromised. There is a need to provide an improved method of controlling a cluster tool apparatus to provide an optimal close down process. There is also a need to provide a method of controlling a cluster tool to account for any failure in the cluster tool apparatus.

It is an object of the present disclosure to provide a cluster tool apparatus with a method of controlling the cluster tool apparatus that will ameliorate one or more of the current problems associated with closing down known cluster tool apparatuses or at least provide the public with a useful alternative.

SUMMARY OF THE INVENTION

In accordance with a first aspect, the present disclosure provides a cluster tool apparatus for processing a semiconductor product comprising:
one or more processing modules located adjacent each other, each processing module being configured to process a semiconductor module,
one or more loadlocks configured to retain and dispense unprocessed semiconductor products, wherein the one or more loadlocks being positioned adjacent one of the one or more processing modules,
a robot configured to load, transfer and unload a semiconductor product to and from the one or more processing modules,
a hardware controller in electronic communication with the robot and configured to execute a method to control the cluster tool apparatus to close down the cluster tool apparatus to an idle state, the method to control the cluster tool apparatus comprising:
determining a status of each of the one or more processing modules,
determining if a close down process is required based on the status of the one or more processing modules or based on a close down signal,
determine a schedule for a close down process based on if a close down process is required,
wherein the schedule is determined based on a semiconductor product residency parameter,
controlling the operation of the robot based on the schedule such that the robot performs the close down process.

In an embodiment the schedule for a close down process outputs the robot waiting time at each step of the close down process that minimizes the close down process time such that the cluster tool apparatus reaches an idle state as quickly as possible, at the same time, the semiconductor product residency parameter is not exceeded.

In an embodiment the close down process comprises removing all semiconductor products from each of the one or more processing modules and returning each semiconductor product to the one of the one or more loadlocks, the close down process further comprises stopping each of the one or more processing modules operation.

In an embodiment the cluster tool apparatus comprises a user interface that is configured to receive inputs from a user and present information to the user,
the user interface being in electronic communication with the controller, the user interface receiving a close down input from the user, the hardware controller receiving a close down signal from the user interface wherein the close down signal corresponds to the close down input,
the hardware controller being configured to determine the schedule in response to receiving a close down signal, wherein the determined schedule corresponds to a normal close down process, and
wherein the hardware controller is configured to control at least the robot based on the determined schedule such that the robot performs a normal close down process.

In an embodiment the hardware controller is configured to determine a schedule that corresponds to a normal close down process by solving a first linear program, the linear program accounting for a semiconductor product residency parameter.

In an embodiment the cluster tool apparatus comprises one or more sensors, wherein each of the one or more sensors is associated with or located on the one or more processing modules, each of the one or more sensor modules being in electronic communication with the hardware controller, and wherein each of the one or more sensors configured to detect a status of the corresponding one or more processing modules.

In an embodiment each of the one or more sensors transmitting status of the processing modules at regular time intervals to the hardware controller, wherein the status comprises a normal status signal or a failed status signal, wherein the failed status signal is generated when any one of the sensors detects a failure in a corresponding one or more of the processing modules.

In an embodiment the hardware controller is configured to determine the schedule in response to receiving a failed status signal, wherein the determined schedule corresponds to a failure close down process.

In an embodiment the hardware controller is configured to control the robot based on the schedule that corresponds to the failure close down process, such that the robot is configured to avoid placing a semiconductor product within any one or more of the processing modules that have experienced a failure and the hardware controller further configured to avoid placing a semiconductor product within a processing module adjacent the failed processing, and wherein the failure being detected by the sensor associated with the processing module.

In an embodiment the hardware controller is configured to determine the specific processing module that has failed based on processing the received status of each processing module, the hardware controller further being configured to select one of a plurality of response policies, wherein each response policy corresponds to the number of total processing modules in the cluster tool apparatus and the specific processing module that has failed.

In an embodiment the hardware controller is configured to select one of two type response policies, wherein the first type response policies (Policies 1-4) are used to determine a schedule for a close down process, such that two or three processing modules including the failed one are disabled, while the other processing modules are sequentially linked together in the cluster tool apparatus, and;

wherein the second type response policy (Policy 5) is used to determine a schedule such that three processing modules including the failed one are disabled, wherein one of the disabled processing modules is the processing module at Step 1 and the other two correspond to the failed processing module and the one adjacent to the failed processing module, while the processing modules except the disabled processing modules cannot be sequentially linked together because, among them, there exists at least one upstream adjacent processing module of the failed processing module and another one that is in its downstream.

In an embodiment the hardware controller is configured to select one of a first, second, third or fourth response policy is used to determine a schedule for a close down process, such that two or three processing modules including the failed one are disabled and the other processing modules except the disabled ones are linked together in the cluster tool apparatus, or;

the controller is configured to implement a fifth response policy which is used to determine a schedule such that three processing modules are disabled, and wherein one of the disabled processing modules is the processing module at Step 1 and the other two correspond to the failed processing module and the one adjacent to the failed processing module, while the processing modules except the disabled processing modules cannot be sequentially linked together.

In an embodiment the controller is configured to determine a schedule that corresponds to a failure close down process by solving a second linear program when a first, second, third or fourth response policy is used wherein the second linear program utilizes at least a specified semiconductor product residency parameter.

In an embodiment the controller is further configured to determine a schedule that corresponds to a failure close down process by solving a third linear program when a fifth response policy is used and wherein the third linear program utilizes at least a specified semiconductor product residency parameter.

In accordance with a second aspect, the present disclosure relates to a method of controlling a cluster tool apparatus to close down the cluster tool apparatus to an idle state, the cluster tool apparatus comprising one or more processing modules, a robot and one or more loadlocks, the cluster tool apparatus configured to process a semiconductor product, the method comprising the steps of:

determining a status of each of the one or more processing modules, determining if a close down process is required based on the status of the one or more processing modules or based on a close down signal, determine a schedule for a close down process based on if a close down process is required, wherein the schedule is determined based on a semiconductor product residency parameter, controlling the operation of the robot based on the schedule such that the robot performs the close down process.

In an embodiment the schedule for a close down process outputs the robot waiting time at each step of the close down process that minimizes the close down process time such that the cluster tool apparatus reaches an idle state as quickly as possible, at the same time, the semiconductor residency parameter is not exceeded, and wherein the close down process comprises removing all semiconductor products from each of the one or more processing modules and returning each semiconductor product to the one of the one or more loadlocks, the close down process further comprises stopping each of the one or more processing modules operation.

In an embodiment the method comprises receiving a close down input from the user and receiving a close down signal from the user interface wherein the close down signal corresponds to the close down input, determining the schedule in response to receiving a close down signal, wherein the determined schedule corresponds to a normal close down process, determining a schedule that corresponds to a normal close down process by solving a first linear program, the linear program accounting for a semiconductor product residency parameter, and controlling the robot based on the determined schedule such that the robot performs a normal close down process.

In an embodiment the method comprises the additional steps of:

receiving a status of the one or more processing modules, wherein the status comprises a normal status signal or a failed status signal, wherein the failed status signal is generated when any one of the sensors detects a failure in a corresponding one or more of the processing modules, determining the schedule in response to receiving a failed status signal, wherein the determined schedule corresponds to a failure close down process, controlling the robot based on the schedule that corresponds to the failure close down process, such that robot is configured to avoid placing a semiconductor product within any one or more of the processing modules that have experienced a failure and controlling the robot to avoid placing a semiconductor product within a processing module adjacent the failed processing, determining the specific processing module that has failed based on processing the received status of each processing module, the hardware controller further being configured to select one of five response policies, wherein each response policy corresponds to the number of total processing modules in the cluster tool apparatus and the specific processing module that has failed.

In an embodiment the method comprises selecting one of two type response policies, wherein the first type response policy (Policies 1-4) are used to determine a schedule for a close down process, such that two or three processing modules including the failed one are disabled, while the other processing modules are sequentially linked together in the cluster tool apparatus, and;

wherein the second response policy is used to determine a schedule such that three processing modules including the failed one are disabled, wherein one of the disabled processing modules is the processing module at Step 1 and the other two correspond to the failed processing module and the one adjacent to the failed processing module, while the processing modules except the disabled processing modules cannot be sequentially linked together because, among them, there exists at least one upstream adjacent processing module of the failed processing module and another one that is in its downstream.

In an embodiment the method comprises determining a schedule that corresponds to a failure close down process by solving a second linear program when a first, second, third or fourth response policy is used wherein the second linear program utilizes at least a specified semiconductor product residency parameter, or the method comprises determining a schedule that corresponds to a failure close down process by solving a third linear program when a fifth response policy is used and wherein the third linear program utilizes at least a specified semiconductor product residency parameter.

BRIEF DESCRIPTION OF THE DRAWINGS

Embodiments of the present invention will now be described, by way of example, with reference to the accompanying drawings in which:

FIG. 4 is a table of system parameters that are used to determine a schedule for a close down process, the system parameters relating to time durations associated with transitions and places in a cluster tool apparatus.

FIG. 5A shows an example of a steady state operation of the cluster tool apparatus.

FIG. 5B shows a deadlock situation of a cluster tool apparatus.

DETAILED DESCRIPTION OF THE PREFERRED EMBODIMENT

Figure 1:
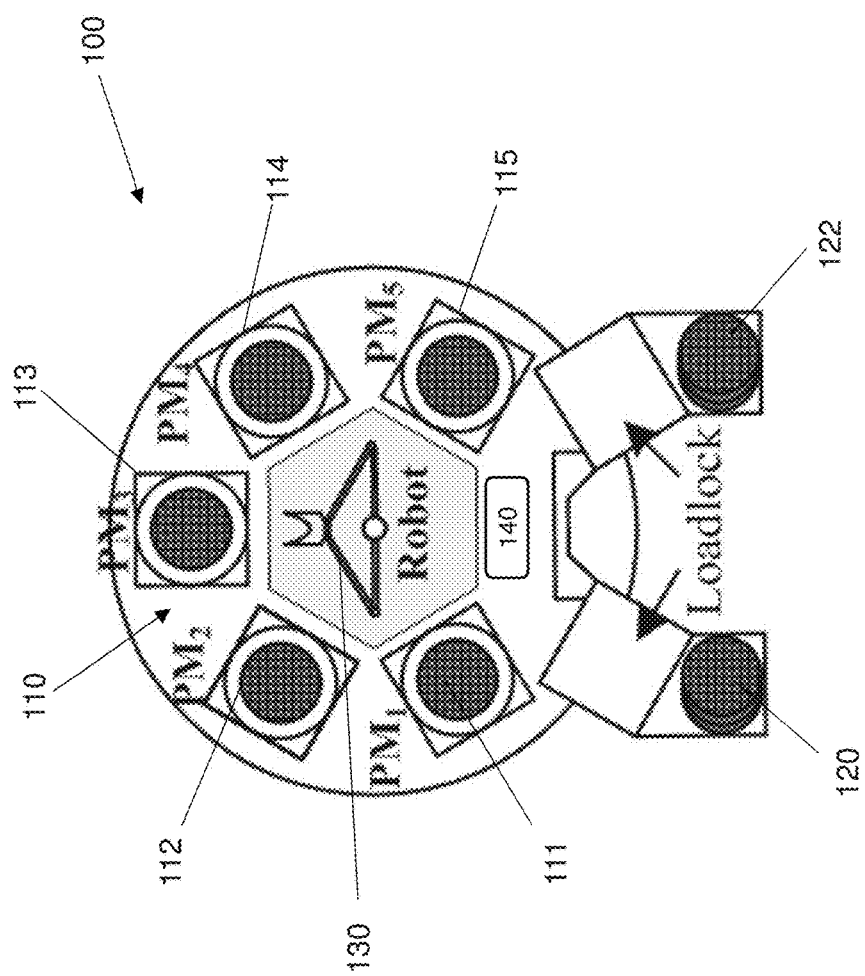
FIG. 1 is a schematic diagram of a single arm cluster tool apparatus that is used in semiconductor product manufacture.

The foregoing describes only a preferred embodiment of a cluster tool apparatus, a method of controlling a cluster tool apparatus, and modifications, obvious to those skilled in the art, can be made thereto without departing from the scope of the present disclosure.

Cluster tool apparatuses are a type of integrated equipment that implements semiconductor processing technology. In particular a cluster tool apparatus is the integrated equipment that implements single wafer processing technology. In this disclosure the semiconductor product is a wafer and the present disclosure will refer to a wafer. It should be understood that the cluster tool apparatus may be used to process any other suitable semiconductor product.

Cluster tool apparatuses can provide a flexible, reconfigurable, and efficient environment, resulting in higher productivity, shorter cycle times, better utilization of space and lower capital expenses. Therefore cluster tools are increasingly used in a semiconductor processing method, such as a wafer fabrication process.

For some semiconductor product (i.e. wafer) fabrication processes, a strict constraint is imposed on the semiconductor product (i.e. wafer) processing or sojourn time. This parameter is referred to as a semiconductor residency parameter (i.e. a wafer residency parameter). The semiconductor residency parameter (i.e. wafer residency parameter) is a time constraint that is defined for a specific wafer processing method. Such a constraint requires that a wafer (i.e. a semiconductor product) should be removed from a processing module within a pre-specified time after being processed. If the wafer is not removed within this specified time then high temperature and chemical gases in the processing module can damage the processed wafer.

A cluster tool apparatus is required to be closed down, following a close down process, for maintenance purposes. The cluster tool apparatus must be closed down by using a specified close down process that is based on a specified semiconductor residency parameter. Further a cluster tool apparatus may undergo a failure. Specifically one or more processing modules in the cluster tool apparatus can fail due to over use or due to some other fault such as an electrical fault in the processing module. The cluster tool apparatus is required to be closed down to an idle state if there is a processing module failure to reduce further damage to the processing module or reduce the chance of providing a wafer into the damaged processing module.

Some cluster tool apparatuses may utilize a plurality of processing modules for a processing step in a processing cycle of a wafer. Such processing modules are termed as parallel processing modules. If a parallel processing module fails, the cluster tool apparatus can continue to function continuously in a performance degraded. However, after a parallel processing module fails, before the cluster tool apparatus enters a steady state (i.e. a normal operating mode) under the degraded environment the cluster tool apparatus under goes at least a close down process (i.e. a transient process) to disable the damaged processing module. The steady state (i.e. normal operating mode) in a degraded environment is often different when in an undamaged environment.

The present disclosure is directed to a cluster tool apparatus and a method of controlling the cluster tool apparatus to close down the cluster tool apparatus to an idle state, while ensuring the semiconductor (i.e. wafer) residency parameter is met. In this manner the cluster tool apparatus and a method of controlling the cluster tool apparatus to close down the cluster apparatus is advantageous because wafers are not damaged as part of the close down process since the semiconductor product residency parameter (i.e. wafer residency time) is not exceeded. A close down process can be classified into two types: 1) a normal close down process that is triggered due to a planned maintenance or a switch for processing another type of wafer and 2) a failure close down process that is triggered by a failure of a processing module.

FIG. 1 shows an embodiment of a single arm cluster tool apparatus 100. The cluster tool apparatus 100 comprises one or more processing modules 110, a pair of loadlocks 120, 122 and a single arm robot 130. As shown in FIG. 1 the single arm cluster tool 100 comprises five processing modules (PMs) 111, 112, 113, 114 and 115 (111-115). FIG. 1 shows that the processing modules 111-115 are also labelled as PM1, PM2, PM3, PM4 and PM5. The following description will refer to the processing modules with the PM notation or with the reference numerals. Either notation refers to the same component.

The processing modules 111-115 are used in processing the semiconductor product (i.e. wafer). The single arm robot 130 comprises a single robotic arm with a single robotic head. The robotic head comprises an appropriate tool, such as, for example, jaws that allow the robotic head to pick up and/or drop off semiconductor products such as silicon wafers. The single arm cluster tool apparatus 100 further includes a user interface 140 such as a touch screen or a screen with associated buttons.

Figure 2:
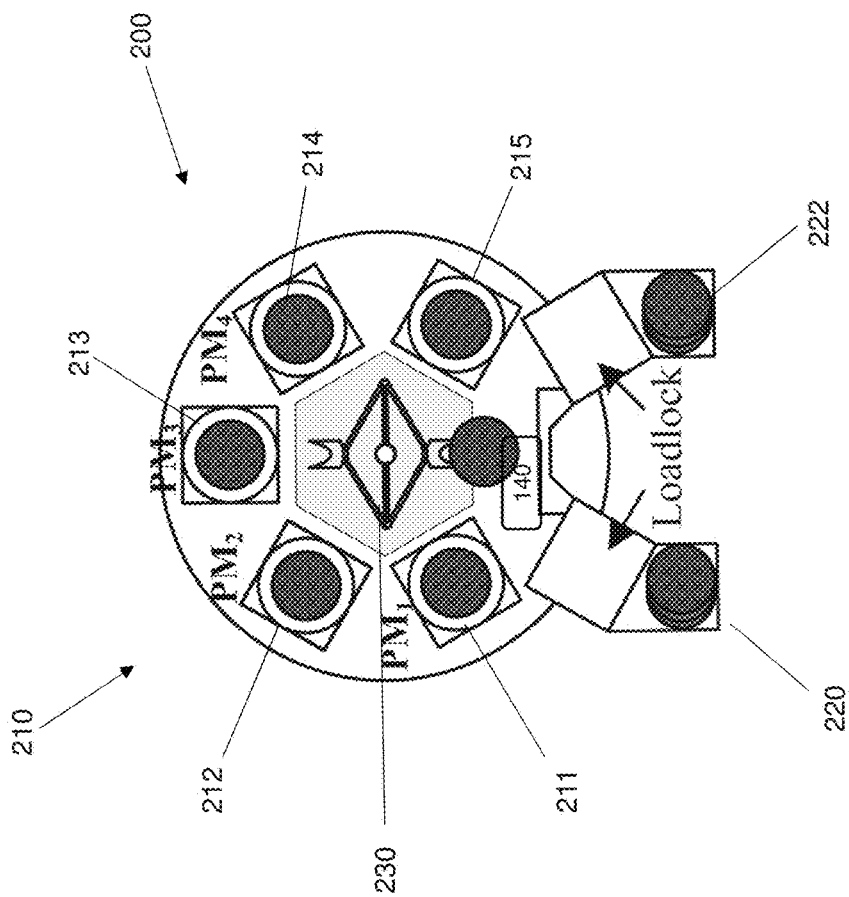
FIG. 2 is a schematic diagram of a dual arm cluster tool apparatus that is used in semiconductor product manufacture.

FIG. 2 shows an embodiment of a dual arm cluster tool apparatus 200. The dual arm cluster tool apparatus 200 comprises one or more processing modules 210, a pair of loadlocks 220, 222 and a dual arm robot 230. As shown in FIG. 2, the dual arm cluster tool 200 comprises five processing modules (PMs) 211, 212, 213, 214 and 215 (211-215). FIG. 2 also illustrates that the processing modules 211-215 can be denoted generally as PM1, PM2, PM3, PM4 and PM5. The processing modules 211-215 are used in processing the semiconductor product (i.e. wafer). The dual arm robot 230 includes two robotic arms and includes two robotic heads that are configured to pick up a semiconductor product (e.g. a wafer) and place the wafer in one of the processing modules 211-215. The dual arm cluster tool apparatus 200 comprises a user interface 240. The user interface 240 may be a touch screen or a screen with a plurality of buttons.

The loadlocks 120, 122 or 220, 222 are used for loading and unloading raw wafers. Raw wafers are loaded or unloaded into a cluster tool in a cassette by a cassette way, and a cassette holds a plurality of wafers. The wafer is transported to an appropriate processing module by the robot 130, 230 for processing, and returned to the loadlock after processing has been completed. Once all the wafers in a cassette have been processed, the cassette is unloaded so that another cassette can be loaded. The order of transporting the wafer to the specific processing modules is dependent on a recipe. At each step the wafer is required to stay within the processing module for a specified time to be processed.

The advantage of using a pair of loadlocks 120, 122 or 220, 222 is advantageous because the cluster tool 100, 200 can operate continuously without interruption. A cluster tool generally operates under a steady state in one of two different regions: a process bound or transport bound regions. In the process bound region or process bound mode the robot task time decides the cycle time of the system. For a process bound mode a backward strategy is an optimal strategy for scheduling the operation of the cluster tool, in particular to control operation of the robot 130, 230.

Figure 3:
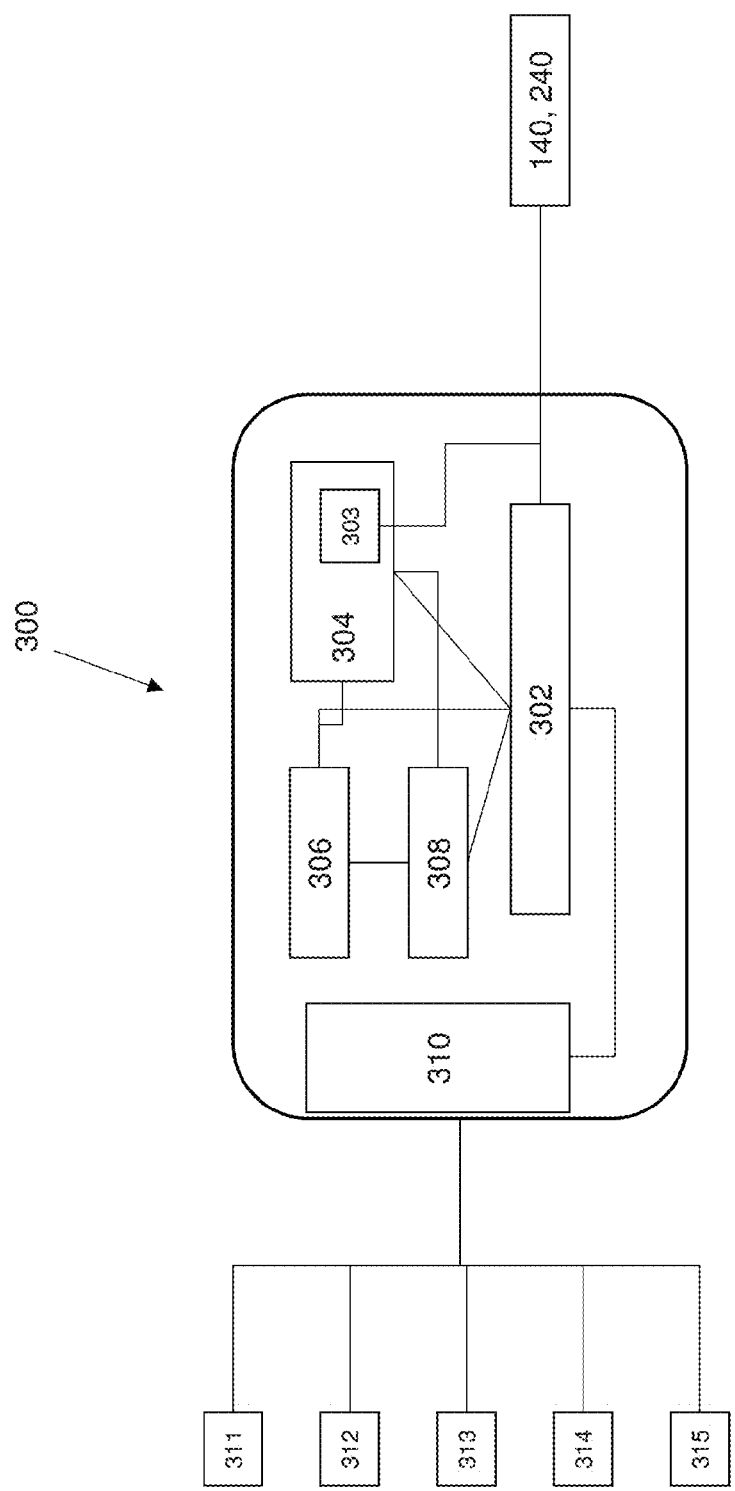
FIG. 3 is a schematic diagram of a controller utilized as part of a cluster tool apparatus.

FIG. 3 shows a schematic of a cluster tool controller 300. The controller 300 is a hardware controller and comprises a plurality of suitable electronic components. The hardware controller 300 comprises suitable analog or digital electronic components or a combination thereof.

The cluster tool 100, 200 comprises a controller that is configured to at least control the robot 130, 230. The controller 300 can be a microcontroller such as, for example, Intel 8051 or a Freescale 68HC11 or ARM Cortex-M or any other suitable microcontroller. The cluster tool 300 may further be configured to control the operation of the processing modules based on a predetermined program or a predefined process. The controller 300 comprises a processor 302 and a memory unit 304. The processor 302 and memory unit 304 are in electronic communication with each other. The processor 302 can be a suitable processor such as a Motorola or Intel processor. The memory unit 304 can be a suitable RAM or ROM memory. The controller 300 further comprises a commercial solver 303. The commercial solver 303 is stored in the memory unit 304 as a set of executable, computer readable instructions. The commercial solver 303, as shown in FIG. 3, represents a software module 303 that is stored in the memory unit 304 and can be executed by the processor to solve a linear program (i.e. an algorithm) to generate an optimal schedule and generate at least the robot waiting times at each processing step in a processing cycle. The commercial solver 303 can be any suitable open source such as, for example, ADMB, LINCOA, and OpenMDAO. Alternatively the commercial solver 303 may a proprietary software such as, for example, AMPL, IOSO, Matlab or NMath.

In a further alternative embodiment the commercial solver 303 may be a hardware module that comprises a suitable processing unit. The commercial solver 303 may be controlled by the processor 302 to solve a linear program to generate a schedule. The commercial solver 303 is configured to solve one or more different types of linear programs that are stored within the memory unit 304.

The hardware controller 300 may further comprise a robot interface 306 that is in electronic communication with the processor 302. The robot interface 306 is also in communication with the robot 130, 230. In particular the robot interface 306 is in communication with a motor or driver of the robot 130, 230. The robot interface may be a wireless communication module that can wirelessly communicate with a suitable interface in the robot 130, 230 to control operation of the robot. The controller 300 further includes one or more processing module interfaces 308. The processing module interface 308 is configured to communicate with the processing modules 111-115, 211-215 and control the operation of the processing modules. The processor 302 is further in electronic communication with a user interface to receive inputs from the user. The processor 302 can also output information for display to the user via the user interface 140, 240.

The memory unit 304 stores a mathematical model (described later) of the cluster tool apparatus. The processor 302 is configured to receive a plurality of system parameters such as time units for various actions of the processing cycle via the user interface 140, 240. The processor 302 is further configured to determine a schedule for performing the processing cycle utilizing the one or more processing modules 111-115, 211-215 and wherein the schedule is determined based on a semiconductor product residency parameter (i.e. a residency time). The processor 302 is configured to determine robot waiting times for processing cycle and uses the robot waiting times to control the robot 130, 230 appropriately. The robot waiting time relates to each processing step of the processing cycle.

The cluster tool apparatus 100, 200 further comprises one or more sensors, wherein each sensor corresponds to or is associated with a processing module of the cluster tool apparatus. Each sensor is preferably located on the processing module and configured to detect a failure in the processing module.

FIG. 3 shows a schematic of the sensors being in electronic communication with the hardware controller 300. In the illustrated embodiment the cluster tool apparatus 100, 200 comprises five sensors 311, 312, 313, 314, 315 (311-315). Each sensor of the five sensors 311-315, is disposed on one of the processing modules 111-115, 211-215. The sensor can be any suitable type of sensor such as, for example, a gas analyzer, an optical sensor, a temperature sensor, a capacitance sensor, a proximity sensor or any other suitable sensor that can be used to determine a failure in the processing module. FIG. 3 shows the hardware controller 300 comprises a sensor interface 310. The sensor interface 310 is in electronic communication with each of the sensors 311-315. The sensor interface 310 comprises suitable electronic components such as a multiplexer and suitable interfacing circuitry. The sensor interface 310 is disposed in electronic communication with the processor 302 to provide sensor readings to the processor 302 for processing. The sensor interface 310 is in electronic communication with the memory unit 304.

Each of the sensors 311-315 detect a status of the processing modules and transmit the status to the processor 302. The status comprises a normal status signal or a failed status signal. The normal status signal is generated by the sensors 311-315 when the processing modules are functioning correctly. A failed status signal is generated by a sensor that detects a failure in one of the processing modules. The processor 302 can receive multiple failed signals if there are multiple processing modules that have experienced failure. The hardware controller 300 is configured to determine a schedule that corresponds to a failure close down process when a failure status signal is received. The processor 302 is configured to process the failure status signal and identify the specific processing modules that have failed based on processing of the failure signal. The sensors 311-315 are configured to transmit a status signal at regular time intervals such as every second or every 10 seconds or any other suitable time interval based on the sampling period of the sensors.

In an alternative embodiment each processing module may include a processing module interface associated with it, and the processor 302 is configured to communicate with and control each processing module via each processing module interface.

It should be noted that the following description is described with reference to a single arm cluster tool apparatus 100. The method of controlling the cluster tool apparatus and the components described herein can be used with the single arm cluster tool apparatus 100 or a dual arm cluster tool apparatus 200. For simplicity the single arm cluster tool 100 will be used as a reference in the following description.

Following is a description of a steady state operation of a cluster tool apparatus, i.e. operation when the cluster tool apparatus is operating to process wafers. The following description of the steady state also assumes that only a single processing module (PM) is used at each processing step. However it should be understood that parallel processing modules i.e. multiple processing modules can be used for a single processing step. The following steady state description is described with respect to a generalized cluster tool apparatus.

Let ($PM_1$, $PM_2$, ..., $PM_n$) denote the wafer flow pattern, where $PM_i$, $i \in N_n = \{1, 2, ..., n\}$ with $n \geq 2$, represents the number of processing modules (PM) at Step i. A wafer needs to be processed at $PM_1$-$PM_n$ sequentially before its completion. The loadlocks 120, 122 can be treated as a processing step denoted by $PM_0$. To schedule a cluster tool is to schedule robot activities that include unloading a wafer from a step, moving from one step to another, loading a wafer into a step, and waiting. $U_i$ and $L_i$ are used to denote the robot unloading and loading a wafer from and into $PM_i$, $i \in \Omega_n = \{0\} \cup N_n$, respectively. The robot moving from $PM_i$ to $PM_j$ with or without carrying a wafer is denoted by $m_{ij}$. When the robot arrives at $PM_i$, $i \in \Omega_n$, for unloading a wafer, the wafer may be not completed yet and the robot has to wait there for the completion of the wafer. Also, to obtain a feasible and optimal schedule, the robot may need to wait there for some time even if the wafer has been already completed. $w_i$ is used to denote such a robot waiting.

Processing module (PM) and robot activities take time and should be described. $\alpha_i$ is used to denote the wafer processing time at $PM_i$, $i \in N_n$. With wafer residency time constraints, after being processed in $PM_i$, a wafer can stay there for at most $\delta_i$ time units. This implies that a wafer can stay in $PM_i$ for a time duration $[\alpha_i, \alpha_i + \delta_i]$ without being damaged. $\tau_i \in [\alpha_i, \alpha_i + \delta_i]$ is used to denote the wafer residency or sojourn time in $PM_i$. By assumption, there are always raw wafers in the loadlocks and there is no processing requirement in $PM_0$, i.e., $\alpha_0 = 0$. There is no wafer residency time constraint in $PM_0$ either. $\mu$ is used to denote the time for the robot moving from one PM to another with or without carrying a wafer. The time taken for the robot's unloading/loading a wafer from/into a PM is same and denoted by $\alpha$. When the robot unloads a wafer from the loadlocks, it needs to align the wafer. Thus, $\alpha_0$ with $\alpha_0 > \alpha$ is used to denote the time for unloading a wafer from $PM_0$. Then, the time taken for $w_i$ is denoted by $\overline{\omega}_i \in [0, \infty)$ that is to be determined by a schedule. FIG. 4 shows a table that provides an explanation of temporal features that is summarized in table 400. Table 400 provides a generalized description of time durations associated with transitions and places for operation of a cluster tool apparatus.

With the robot activity time being much shorter than the wafer processing time in practice, a cluster tool is process-bound. In this case, to achieve the maximal production rate, the wafers being processed in the system should be as many as possible, leading to that every PM (step) has one wafer being processed under the steady state. Let M denote a state of a cluster tool. $M(PM_i)=1$, $i \in N_n$, denotes that a wafer is being processed in $PM_i$, $M(R)=1$ denotes that the robot arm is busy, and $M(R)=0$ that it is idle. Then, under the steady state, every PM has one wafer being processed, i.e., $M(PM_i)=1$, $i \in N_n$, and $M(R)=0$. A backward strategy is used to operate a single-arm cluster tool apparatus 100. The backward strategy is well known and is applied by the hardware controller 300 to control the operation of the cluster tool apparatus 100.

Figure 6:
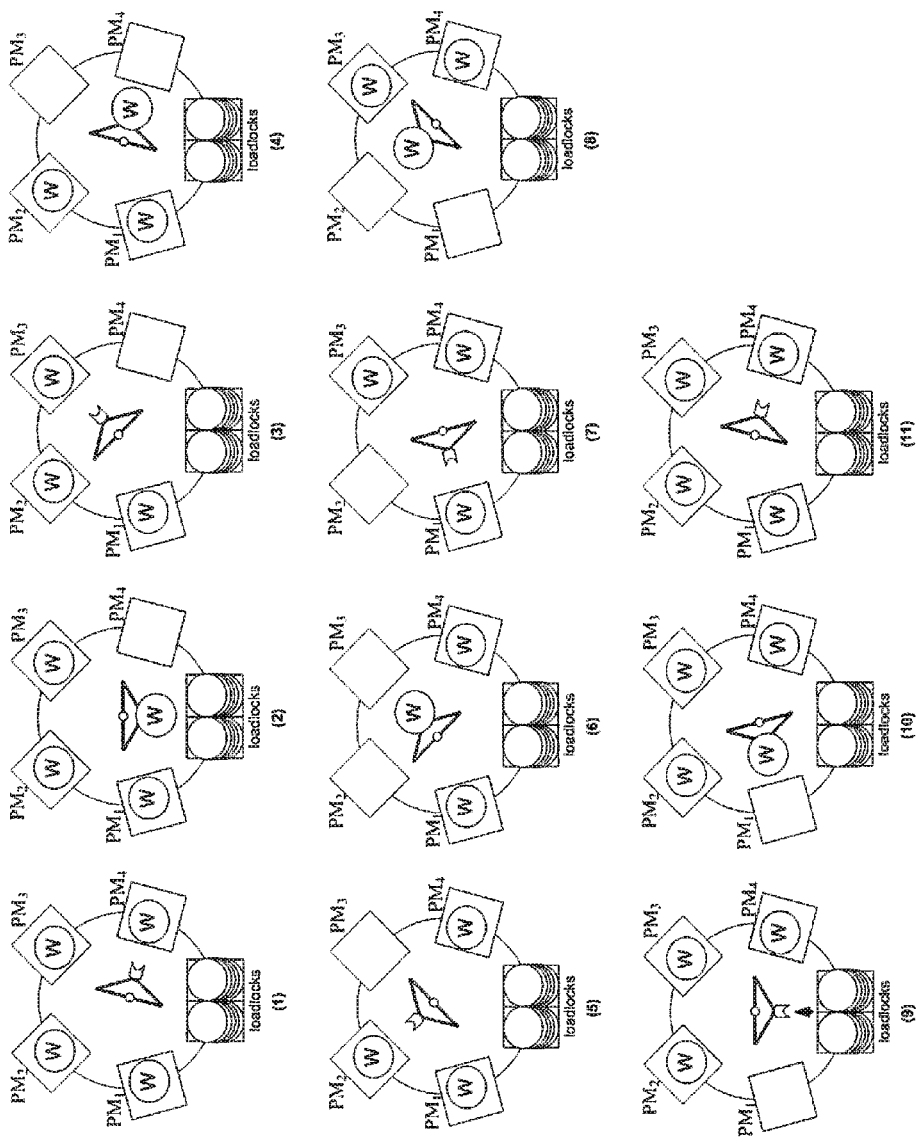
FIG. 6 shows a robot task cycle that is completed without deadlock with a backward strategy. The robot repeats the above robot task sequence continuously under the steady state.

An example with wafer flow pattern ($PM_1$, $PM_2$, $PM_3$, $PM_4$) is used to show how a backward strategy works. For this example, under the steady state, $M(PM_i)=1$, $i \in N_4$, and $M(R)=0$ as shown in FIG. 5A. FIG. 5A shows an example of a steady state operation of the cluster tool apparatus 100. As seen in FIG. 5b, the robot goes to the loadlocks 120, 122, unloads a wafer there, and moves to $PM_1$ (111), the system is deadlocked. FIG. 5B shows a deadlock situation of a cluster tool apparatus. Similarly, at this state, if the robot goes to $PM_i$, $i \in N_3$, and unloads a wafer there, then a deadlock occurs too. The only feasible way is that the robot goes to $PM_4$, unloads a wafer there, and delivers it to the loadlocks such that $PM_4$ is released. Then, the robot performs the activities sequentially: goes to $PM_3 \rightarrow$unloads a wafer there$\rightarrow$delivers it to $PM_4 \rightarrow$goes to $PM_2$ and unloads a wafer there$\rightarrow$delivers the wafer to $PM_3 \rightarrow$goes to $PM_1$ and unloads a wafer there$\rightarrow$delivers the wafer to $PM_2 \rightarrow$goes to the loadlocks and unloads a raw wafer$\rightarrow$delivers the wafer to $PM_1$. At this time, $M(PM_i)=1$, $i \in N_4$, and $M(R)=0$. In this way, a robot task cycle is completed with no deadlock as shown from (1)-(11) in FIG. 6. FIG. 6 shows a robot task cycle that is completed without deadlock with a backward strategy. The robot repeats the above robot task sequence continuously under the steady state.

To simplify the description of such a robot task sequence, let $A_{ij} = \langle w_i \rightarrow U_i \rightarrow m_{ij} \rightarrow L_j \rangle$. Then, let $A_{ij} \oplus A_{di}$ denote that, after the robot performs $A_{ij}$, it moves to $PM_d$ for performing $A_{di}$, i.e., $A_{ij} \oplus A_{di} = \langle A_{ij} \rightarrow m_{jd} \rightarrow A_{di} \rangle$. Given $i \geq d+1$, let $A_{i(i+1)} \otimes A_{d(d+1)}$ denote $A_{i(i+1)} \oplus A_{(i-1)i} \oplus \ldots \oplus A_{d(d+1)}$. Let $A_{d(d+1)} \otimes A_{d(d+1)} = A_{d(d+1)}$. Given $i<d$, let $A_{i(i+1)} \otimes A_{d(d+1)} = \emptyset$. For example, $A_{23} \otimes A_{12} = A_{23} \oplus A_{12}$ and $A_{45} \otimes A_{01} = A_{45} \oplus A_{34} \oplus A_{23} \oplus A_{12} \oplus A_{01}$, $A_{23} \otimes A_{23} = A_{23}$, while $A_{12} \otimes A_{23} = \emptyset$. Therefore, for a general case with ($PM_1$, $PM_2$, . . . , $PM_n$), by a backward strategy, the robot task sequence in a cycle can be described as $\sigma_1 = \langle m_{1n} \rightarrow A_{n0} \oplus A_{(n-1)n} \otimes A_{01} \rangle$, $n \geq 2$, under the steady state.

As described earlier a cluster tool apparatus 100 may require a close down process to be implemented. A cluster tool apparatus may require a close down process for the following two situations: 1) due to a planned maintenance or a switch for processing another type of wafer and 2) due to a failure of a processing module. In situation 1) a normal close down process is implemented and in situation 2) a failure close down process is implemented.

The following is a description of a normal close down scheduling process. If there is only one step (a PM) in a single-arm cluster tool, it is very easy to verify that the robot task sequence $\sigma_2 = \langle U_0 \rightarrow m_{01} \rightarrow L_1 \rightarrow w_1 \rightarrow U_1 \rightarrow m_{10} \rightarrow L_0 \rangle$ can be repeated continuously under the steady state. With n(n>1) PMs in a tool, robot task sequence $\sigma_1$ is repeated continuously under the steady state. By performing $L_i$, the robot loads a wafer into $PM_i$. Then, with a backward strategy, robot task sequence $\sigma_3 = \langle m_{i(i-2)} \rightarrow A_{(i-2)(i-1)} \otimes A_{01} \rangle$ is performed to reach state $M_s$ with $M_s(PM_i)=1$, $i \in N_n$, $M_s(R)=0$, and the robot is at $PM_1$. When $M_s$ is reached, the wafer sojourn or residency time in $PM_i$ is the time taken by performing $\sigma_3$. Let $\tau_i^j$ denote the wafer sojourn time in $PM_i$, $i \in N_n$, when state $M_j$ is reached. Therefore $\tau_1^s = 0$ and $$\tau_i^s = 2 \times (i-1) \times \mu + (2 \times i - 3) \times \alpha + \alpha_0 + \sum_{j=0}^{i-2} \varpi_j, \quad (3.1)$$

$$i \in N_n \setminus \{1\}$$

If there is only one PM in a tool, the best way to close down the tool is to perform robot task sequence $\langle w_1 \rightarrow U_1 \rightarrow m_{10} \rightarrow L_0 \rangle$. If there is more than one PM, the controller 300 is configured to use a backward strategy. Let $M_s C_j$, $j \geq 1$, represent a state that is reached during the close-down process from $M_s$ to the final idle state such that $PM_j$ is emptied and a wafer is just loaded into $PM_{j+1}$. Then, to transfer $M_s$ to $M_s C_1$, robot task sequence $\langle m_{1n} \rightarrow A_{n0} \otimes A_{(n-1)n} \otimes A_{12} \rangle$ is performed. To transfer $M_s C_i$ to $M_s C_{i+1}$, $1 \leq i \leq n-2$, $\langle m_{(i+1)n} \rightarrow A_{n0} \otimes A_{(n-1)n} \otimes A_{(i+1)(i+2)} \rangle$ is performed. When $M_s C_{n-1}$ is reached, there is a wafer in $PM_n$ only and the robot is at $PM_n$. Thus, to transfer $M_s C_{n-1}$ to the final idle state, $A_{n0}$ is performed. In this way, the tool is finally emptied.

Figure 7:
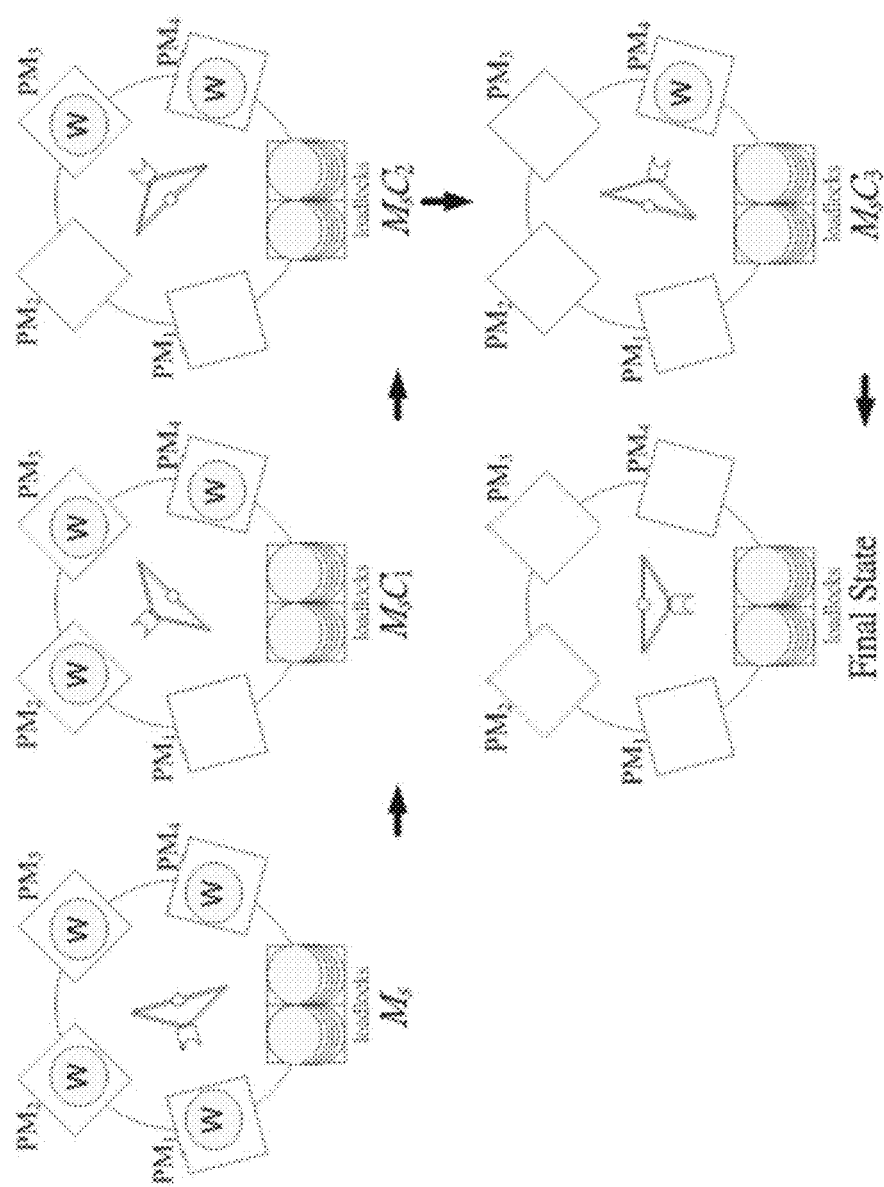
FIG. 7 shows an example with wafer flow pattern that illustrates the state evolution during the normal close-down process.

FIG. 7 shows an example with wafer flow pattern ($PM_1$, $PM_2$, $PM_3$, $PM_4$) that shows the state evolution during the normal close-down process. By doing so, the robot task sequence for the close-down process is determined. With this robot task sequence, it is desired that the process can be completed as soon as possible and, at the same time, the wafer residency time constraints are satisfied. Thus, to schedule the normal close-down process the robot waiting time is set, such that the process ends as soon as possible and the wafer residency time constraints are satisfied.

The schedule that is determined provides at least the robot waiting time and such that a semiconductor residency parameter (i.e. a wafer residency parameter) is met. The user interface 140 is configured to receive a close down input from a user, and the hardware controller 300 is configured to receive a close down signal from the user interface 140. The close down signal corresponds to the close down input. The hardware controller 300 is further configured to determine the schedule in response to receiving a close down signal, and wherein the determined schedule corresponds to a normal close down process. The hardware controller 300 is configured to control at least the robot 130 based on the determined schedule such that the robot 130 performs the normal close down process as shown in FIG. 7. The schedule that corresponds to the normal close down process is determined by solving a first linear program. The linear program accounts for a semiconductor product residency parameter. The first linear program can be solved by the commercial solver 306, in the hardware controller 300 to determine a schedule that corresponds with a normal close down process.

For a single arm cluster tool apparatus 100, with the backward strategy, an optimal and feasible schedule for a normal close down process from $M_s$ to the final idle state can be obtained by the first linear programing model. Below is the first linear program (LP1):

$$\text{Min } y_0^n \quad (3.2)$$

Subject to:

$$x_n^1 = \bar{\omega}_n^1 + \alpha, n=1 \quad (3.3)$$

$$x_n^1 = \mu + \bar{\omega}_n^1 + \alpha, n>1 \quad (3.4)$$

$$x_n^d = y_d^{d-1} + \mu + \bar{\omega}_n^d + \alpha, 2 \leq d \leq n-1 \quad (3.5)$$

$$x_n^n = y_n^{n-1} + \bar{\omega}_n^n + \alpha, n>1 \quad (3.6)$$

$$x_{n-1}^d = y_0^d + \mu + \bar{\omega}_{n-1}^d + \alpha, 1 \leq d \leq n-1 \quad (3.7)$$

$$x_i^d = y_{i+2}^d + \mu + \bar{\omega}_i^d + + \alpha, 1 \leq d \leq i \leq n-2 \quad (3.8)$$

$$y_0^d = x_n^d + \mu + \alpha, 1 \leq d \leq n \quad (3.9)$$

$$y_i^d = x_{i-1}^d + \mu + \alpha, 1 \leq d < i \leq n \quad (3.10)$$

$$\alpha_i \leq \tau_i^s + x_i^1 - \alpha \leq \alpha_i + \delta_i, 1 \leq i \leq n \quad (3.11)$$

$$\alpha_i \leq x_i^d - y_i^{d-1} - \alpha \leq \alpha_i + \delta_i, 2 \leq d \leq i \leq n \quad (3.12)$$

In LP1, $x_i^d$ and $y_i^d$, $i \in \Omega_n$, denote the time for the d-th completion of robot tasks $U_i$ and $L_i$, respectively, $\bar{\omega}_1^d$ denotes the time taken for the robot to perform the d-th $w_i$ during for optimizing the close-down process, and n denotes the number of PMs in a cluster tool. Objective (3.2) minimizes the makespan of the close-down process. Constraints (3.3)-(3.8) represent the time to perform the robot task of unloading a wafer from a PM. Constraints (3.9) and (3.10) give the time to perform the robot task of loading a wafer into a PM. Constraints (3.11) and (3.12) guarantee that wafer residency time constraints are satisfied.

Note that, if there is only one processing module (PM) in the cluster tool apparatus 100, i.e., n=1, Expressions (3.3), (3.9), and (3.11) are applied. Thus, by solving the first linear program (LP1) $\bar{\omega}_n^1 = \alpha_1$ is obtained. Based on the above analysis, when a cluster tool has only one PM, the best way to close down the tool is to perform robot task sequence $\langle w_1 \to U_1 \to m_{10} \to L_0 \rangle$. Therefore, with the known robot task sequence and the robot waiting time obtained by LP1, an optimal and feasible schedule for the normal close-down process is found. Similarly, when n>1, with the given robot task sequence and the robot waiting time obtained by LP1, an optimal and feasible schedule for the close-down process is obtained. Under the steady state, a cluster tool with wafer residency time constraints should be operated under a feasible periodic schedule.

When a tool has only one PM, with $\bar{\omega}_n^1 = \alpha_1$ obtained by LP1, an optimal and feasible schedule is obtained. From state $M_s$, assume that the system is operated according to the given feasible periodic schedule for the steady state, however, every time when the robot needs to unload a wafer from the loadlocks, it unloads a virtual wafer. Then, one wafer is completed and returned to the loadlocks in each robot cycle. In this way, after n robot cycles, all the real wafers are returned to the loadlocks and the tool is full of virtual wafers. This implies that the close-down process is completed. During the i-th robot cycle, $i \leq n-1$, the robot task sequence performed is $\sigma_1$. Further, during this cycle, after $\langle (m_{1n} \to A_{n0} \oplus A_{(n-1)n} \otimes A_{i(i+1)} \rangle$ is performed, a real wafer in $PM_i$ is delivered to $PM_{i+1}$. At this time, there is a virtual wafer in $PM_j$, i.e., $PM_j$ is idle, $1 \leq j \leq i-1$. Then, in this cycle, the robot executes task sequence $\sigma_4 = \langle m_{(i+1)(i-1)} \to A_{(i-1)i} \otimes A_{01} \rangle$. Note that, in performing $\sigma_4$, every PM visited by the robot is idle, which implies that the robot does not need to visit these PMs. Thus, the time taken by performing $\sigma_4$ can be treated as the robot waiting time at $PM_n$ in the (i+1)-th cycle. The robot waiting time at $PM_n$ in the (i+1)-th cycle is the one determined by the periodic schedule for the steady state plus the time taken by performing $\sigma_4$. In this way, the robot task sequence for the i-th robot cycle becomes $\langle m_{in} \to A_{n0} \oplus A_{(n-1)n} \otimes A_{i(i+1)} \rangle$, $i \leq n-1$, with the robot waiting time in $\langle A_{(n-1)n} \otimes A_{i(i+1)} \rangle$ being set by the steady state schedule.

Since the periodic schedule is feasible, during the i-th robot cycle, the residency time constraints must be met. After the (n-1)-th robot cycle is performed, the robot is at $PM_n$ after it loads a wafer into $PM_n$. At this time, in the tool, there is a wafer in $PM_n$ only. Thus, the robot needs just to wait at $PM_n$ till the wafer is completed. Then, it performs task sequence $\langle U_n \to m_{n0} \to L_0 \rangle$ to return the wafer in $PM_n$ to the loadlocks. In other words, after the (n-1)-th robot cycle, the robot performs $A_{n0}$ with $\bar{\omega}_n = \alpha_1$ such that the wafer in $PM_n$ is returned to the loadlocks without violating the residency time constraints. In this way, a feasible close-down schedule is obtained. Notice that the robot task sequence for the first robot cycle is same as the one from $M_s$ to $M_sC_1$, the robot task sequence for the i-th robot cycle is same as the one from $M_sC_{i-1}$ to $M_sC_i$, $1 < i \leq n-1$. Then, when the robot enters the n-th robot cycle or state $M_sC_{n-1}$ is reached, the robot performs $A_{n0}$ such that the close-down process ends. This implies that the obtained feasible schedule is in the feasible region of the first linear program (LP1).

When a single-arm cluster tool needs to stop, there is a close-down process from the steady state to the idle state. Since a backward strategy is applied to operate the tool, the robot task sequence of the close-down process is determined. Thus, the robot waiting time is set for the close-down process as defined by an optimal schedule. LP1 is developed to obtain an optimal and feasible schedule for the normal close down process.

The following is a description of a failure close down process and how to determine a schedule that corresponds to a failure close down process.

When $PM_j$, $j \in N_n$, fails, the robot has to stop loading raw wafers into the system and a close-down process is initiated. When a PM fails, there is a wafer being processed in it as implied by the steady state operations. Thus, the wafer in the failed PM should be returned to the loadlocks since it most likely suffers from a quality problem. Meanwhile, the degraded tool should keep processing the wafers in $PM_i$, $i \in N_n \backslash N_j$, till their n-th operation is completed. For the wafers in $PM_i$, $i \in N_{j-1}$, after the operations at $PM_1$-$PM_{j-1}$ are all completed, they should be returned to the loadlocks directly without processing at $PM_i$, $i \in N_n \backslash N_{j-1}$ to avoid loading wafers into the failed PM. When the tool is emptied, the system stops. Now, our goal is to schedule the close-down process after $PM_j$, $j \in N_n$, fails. Let G(t) denote the G(t)-th performing of the robot task t after a failure.

As described earlier the cluster tool apparatus comprises a plurality of sensors, wherein each sensor is associated with or connected to one of the processing modules. Each sensor is configured to detect a status of the corresponding processing module. Each sensor transmits the status of the processing module at regular times to the hardware controller 300. The status comprises a normal status or a failed status signal, wherein the failed status signal is generated when one of the sensors detects a failure in a corresponding processing module. The hardware controller 300 is configured to determine an optimal and feasible schedule in response to receiving a failed status signal and wherein the determined schedule corresponds to a failure close down process. The controller 300 is configured to control the robot based on the determined schedule that relates to a failure close down process. The hardware controller 300 is configured to implement one of two type response policies. In an embodiment the hardware controller 300 is configured to implement five response policies based on the number of processing modules in the cluster tool apparatus and the specific processing module that has failed.

In an embodiment the hardware controller is configured to implement one of a first, second, third or fourth response policy is used to determine a schedule for a close down process, such that two or three processing modules including the failed one are disabled, while the other processing modules are sequentially linked together in the cluster tool apparatus. Alternatively the hardware controller 300 is configured to implement a fifth response policy which is used to determine a schedule such that three processing modules including the failed one are disabled, wherein one of the disabled processing modules is the processing module at Step 1 and the other two correspond to the failed processing module and the one adjacent to the failed processing module, while the processing modules except the disabled processing modules cannot be sequentially linked together.

Case 1: $PM_1$ Failure.

The following is a description of the response policies and associated linear programs that can be implemented by the hardware controller 300.

Response policy 1 (RP1) is used if a first processing module $PM_1$ is detected as failing. After the failure of $PM_1$, when the robot unloads a wafer from $PM_1$ with $G(x_1)=1$, robot task sequence $\langle m_{10} \rightarrow L_0 \rangle$ is followed such that state $M_1$ is reached with $M_1(PM_1)=M_1(PM_2)=0$, $M_1(PM_i)=1$, $i \in N_n \backslash \{1, 2\}$, and $M_1(R)=0$.

$PM_1$ failure can cause a quality problem to the wafer in it. After the failure, when the robot unloads a wafer from $PM_1$ with $G(x_1)=1$, if the system still operates according to the steady state schedule, robot task sequence $\langle m_{12} \rightarrow L_2 \rangle$ is followed, resulting in a wafer with a quality problem being loaded into the $PM_2$. However, if the system responds to the failure by RP1 such that $M_1$ is reached, such an undesired operation is avoided. In this case, if there are only two processing steps, i.e., only $PM_1$ and $PM_2$ are used, results in $M_1(PM_1)=M_1(PM_2)=M_1(R)=0$. This implies that the tool is emptied and the close-down process ends. With more than two PMs in a cluster tool, before $M_1$ is reached, $L_i$, $i \in N_n \backslash \{1, 2\}$, is performed such that a wafer is loaded into $PM_i$. Then, with the backward strategy, if $i>3$, robot task sequence $\langle m_{i(i-2)} \rightarrow A_{(i-2)(i-1)} \otimes A_{23} \rightarrow m_{31} \rightarrow w_1 \rightarrow U_1 \rangle$ is executed, while if $i=3$, robot task sequence $\langle m_{31} \rightarrow w_1 \rightarrow U_1 \rangle$ is executed. At this time, assume $G(x_1)=1$. By RP1, robot task sequence $(m_{10} \rightarrow L_0)$ is then performed such that $M_1$ is reached and the robot is at the loadlocks. Thus, the wafer sojourn time is defined by:

$$\tau_i^1 = 2 \times (i-2) \times \mu + 2 \times (i-2) \times \alpha + \sum_{j=1}^{i-2} \varpi_j, \quad (3.13)$$

$3 \le i \le n$

Figure 8:
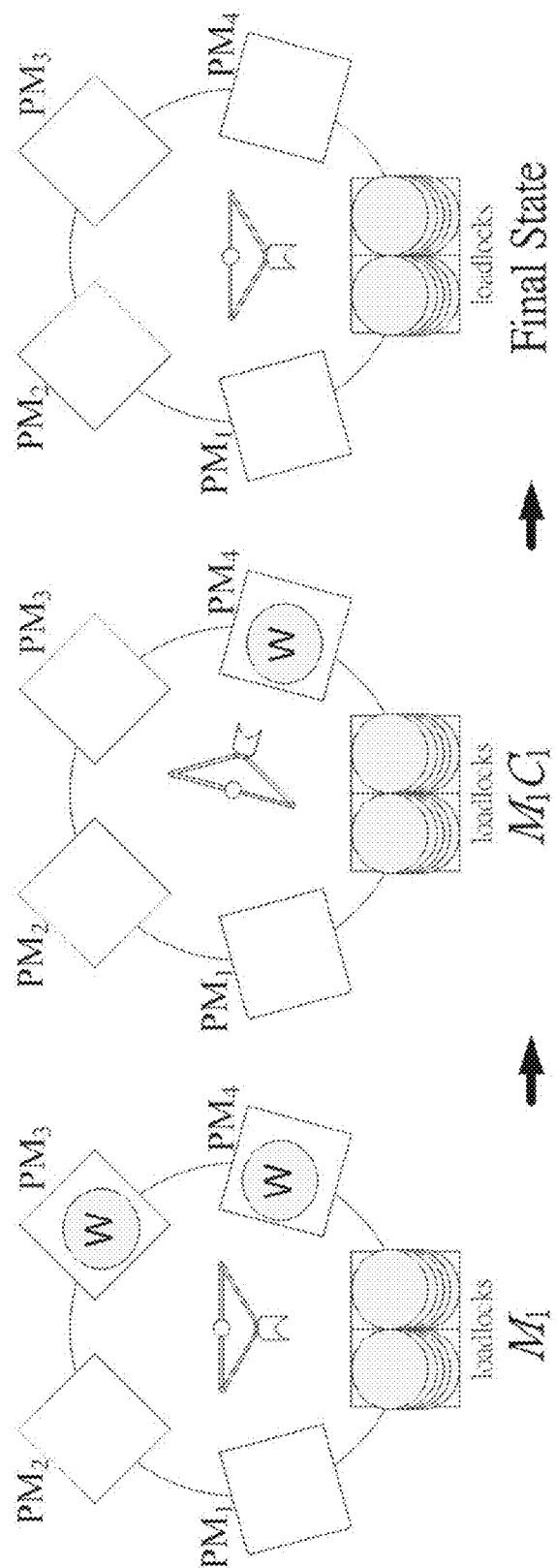
FIG. 8 shows an example of a wafer flow pattern for a failure close down process based on a first response policy.

Then, the backward strategy is continued to operate the tool. Thus, if there are three PMs in the tool, at $M_1$, there is a wafer in $PM_3$ only. Then, by performing $\langle m_{03} \rightarrow A_{30} \rangle$, the close-down process of the tool ends. If there are more than three PMs in the tool, let $M_1 C_j$, $j \ge 1$, represent a state that is reached during the close-down process from $M_1$ to the final idle state such that $PM_{j+2}$ is emptied and a wafer is just loaded into $PM_{j+3}$. Then, to transfer $M_1$ to $M_1 C_1$, robot task sequence $\langle m_{0n} \rightarrow A_{n0} \oplus A_{(n-1)n} \otimes A_{34} \rangle$ is performed. To transfer $M_1 C_i$ to $M_1 C_{i+1}$, $1 \le i < n-3$, $\langle m_{(i+3)n} \rightarrow A_{n0} \otimes A_{(n-1)n} \otimes A_{(i+3)(i+4)} \rangle$ is performed. When $M_1 C_{n-3}$ is reached, there is a wafer in $PM_n$ only and the robot is at $PM_n$. Thus, to transfer $M_1 C_{n-3}$ to the idle state, $A_{n0}$ is performed. In FIG. 8, an example with wafer flow pattern ($PM_1$, $PM_2$, $PM_3$, $PM_4$) is given to show the state evolution during the close-down process by using response policy 1. As can be seen from the process flow the first processing module (i.e. the damaged processing module) and the adjacent processing module are avoided from being used. FIG. 8 shows an example of a wafer flow pattern for a failure close down process based on a first response policy RP1.

Note that the close-down process with a processing module (PM) failure considered is similar to the one without PM failure. Thus, in this case, LP1 can be used with a minor revision to optimize the close-down process from $M_1$ to the idle state. At $M_1$, there is a wafer in $PM_i$, $i \in N_n \backslash \{1, 2\}$, while both $PM_1$ and $PM_2$ are emptied. Then, with the two emptied PMs being removed from the cluster tool apparatus i.e. being disabled, the other processing modules are still linked together in the cluster tool apparatus. Thus, it results in a "reduced" cluster tool called CT-RI with a state at which the robot is at the loadlocks, and there are n−2 processing modules (PMs) and there is a wafer in each of the PMs. In CT-RI, $PM_{i-2}$ is used to denote $PM_i$, $3 \le i \le n$, and the state of CT-RI at this time is denoted as $M_2$ that is similar to $M_s$. The difference is that, at $M_2$, the robot is at the loadlocks but not at $PM_1$. Let $\tau_{i-2}^2$ in CT-RI represent $\tau_i^1$, $3 \le i \le n$. When there is only one processing module ($PM_1$) in CT-RI at $M_2$, the robot needs to move to the PM from the loadlocks, wait there, and unload a wafer from it. Then, by performing $\langle m_{10} \rightarrow L_0 \rangle$, the close-down process ends. This implies that Constraint (3.3) does not hold for this situation and Constraints (3.3) and (3.4) are replaced by $$x_n^1 = \mu + \overline{\omega}_n^1 + \alpha, \quad (3.14)$$

Therefore a linear program can be used to determine an optimal schedule for the above case. For CT-RI, an optimal and feasible schedule for the failure close down process from state $M_2$ to the end can be found by the following linear programing model i.e. linear program 2 (LP2).

$$\min y_0^n$$

Subject to: Constraints (3.5)-(3.10), (3.12), (3.14), and $$\alpha_i \le \tau_i^2 + x_i^1 - \alpha \le \alpha_i + \delta_i, 1 \le i \le n \quad (3.15)$$

In LP2, n denotes the number of PMs in CT-RI and Constraint (3.15) guarantees that wafer residency time constraints are satisfied. Note that CT-RI is a reduced tool.

It is assumed that before a PM failure, if a single-arm cluster tool with residency time constraints is operated under a feasible periodic schedule in the steady state, then an optimal and feasible close-down schedule can be obtained for CT-RI by LP2 for this case. The obtained optimal and feasible schedule for the close-down process from $M_2$ to the end for CT-RI can be converted into a schedule for the close-down process from $M_1$ to the end for the original cluster tool.

Figure 9:
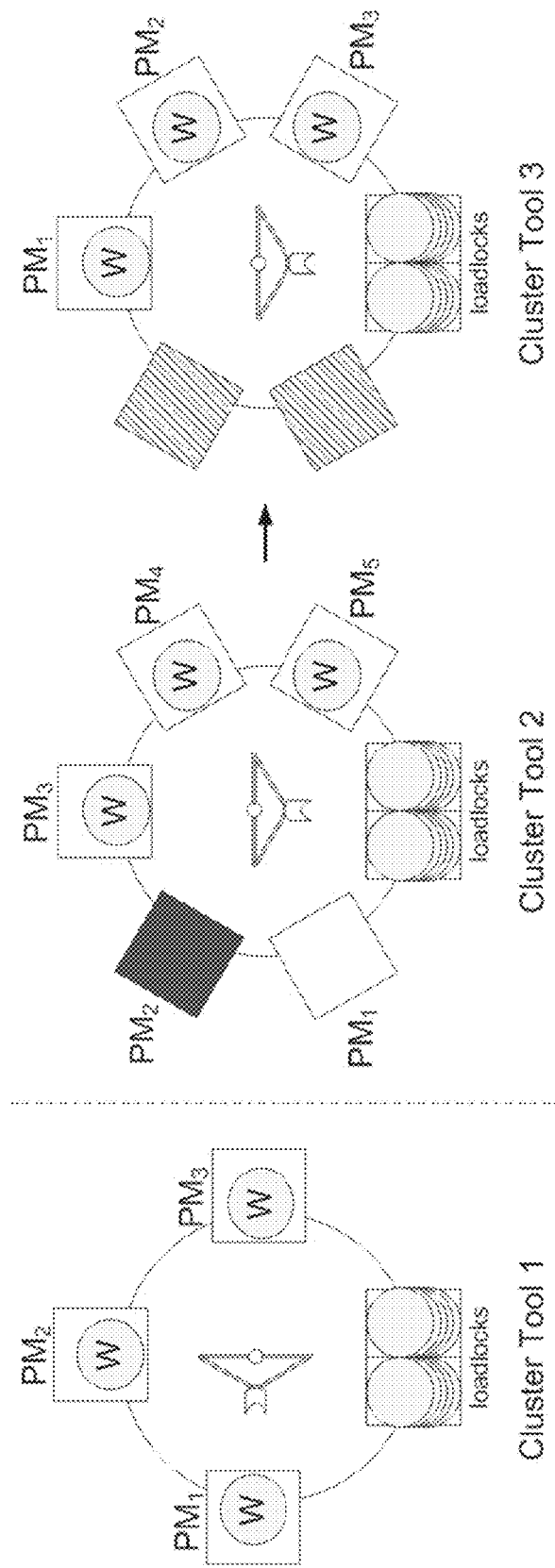
FIG. 9 shows an example of a second linear program can be applied to a cluster tool with a failed processing module.

This is illustrated by the example shown in FIG. 9. FIG. 9 shows an example of a second linear program can be applied to a cluster tool with a failed processing module. For Cluster Tool 1 in FIG. 9, there are three processing modules (PMs) with a wafer in each of them. At this time, the robot is at $PM_1$ after loading a wafer into it. Thus, at this time, Cluster Tool 1 is at $M_s$. Then, by linear program LP1, an optimal and feasible schedule for the close-down process from $M_s$ to the end can be obtained for Cluster Tool 1. For Cluster Tool 2 with five PMs, $PM_1$ fails at some time. Then, by response policy 1 (RP1), the cluster tool apparatus reaches state $M_1$ with $M_1(PM_1)=M_1(PM_2)=0$ and $M_1(PM_3)=M_1(PM_4)=M_1(PM_5)=1$. At this time, the robot is at the loadlocks. Notice that, at this time, $PM_1$ and $PM_2$ are both emptied and there is wafer in $PM_3$-$PM_4$ such that $PM_3$-$PM_4$ form a reduced CT-RI denoted by Cluster Tool 3 in the figure that is at state $M_2$. For Cluster Tool 3, let $PM_{i-2}$ and $\tau_{i-2}^2$, $3 \le i \le 5$, represent $PM_i$ and $\tau_i^1$ for Cluster Tool 2, respectively. Then, an optimal and feasible close-down schedule for Cluster Tool 3 is obtained, which can be converted into the one for Cluster Tool 2. Notice that the state of Cluster Tool 3 is very similar to state $M_s$ of Cluster Tool 1. The only difference is that the robot in Cluster Tool 3 is at the loadlocks. Then, LP2 obtained based on LP1 can be used to find an optimal and feasible close-down schedule for Cluster Tool 3 and the obtained schedule can be converted into the one for Cluster Tool 2.

Case 2: $PM_2$ Failure.

A response policy for $PM_2$ failure is different from the one for $PM_1$ failure. Response policy 2 (RP2) is proposed for when $PM_2$ fails. After $PM_2$ fails, when the robot unloads a wafer from $PM_2$ with $G(x_2)=1$, robot task sequence $\langle m_{20} \to L_0 \to m_{01} \to A_{10} \rangle$ is followed with the robot waiting time $\bar{\omega}_1$ being same as the one in the optimal periodic schedule.

In this case, after $PM_2$ fails, the system responds by RP2 such that it reaches state $M_3$ at which if there are two PMs in the system, $M_3(PM_1)=M_3(PM_2)=M_3(R)=0$; if there are three PMs used in the system, the following definition is true $M_3(PM_1)=M_3(PM_2)=M_3(PM_3)=M_3(R)=0$. If there are more than three PMs in the system, then $M_3(PM_1)=M_3(PM_2)=M_3(PM_3)=0$, $M_3(PM_i)=1$, $i \in N_n \backslash \{1, 2, 3\}$, and $M_3(R)=0$. In this way, the controller 300 is configured to control the robot such that the robot avoids loading a wafer into a failed PM. For a single-arm cluster tool with wafer flow pattern ($PM_1$, $PM_2$) or ($PM_1$, $PM_2$, $PM_3$), after $PM_2$ fails, by RP2, the system can reach state $M_3$. At this time, the tool is idle. Therefore, the close-down process ends. If there are more than three PMs in the tool, when $M_3$ is reached, the close-down process from $M_3$ to the end is similar to the one in Case 1. Thus, similar to Case 1, an optimal and feasible close-down schedule can be found for this case.

The response policies for $PM_n$ failure with $n \ge 3$ (case 3) and $PM_{n-1}$ failure with $n \ge 4$ (case 4) are different from those in cases described above, i.e. response policy 1 and response policy 2.

Case 3: $PM_n$ Failure with $n \ge 3$

A third response policy can be implemented by the hardware controller 300 if $PM_n$ failure with $n \ge 3$. After $PM_n$ fails, after the robot unloads a wafer from $PM_n$ with $G(x_n)=1$, robot task sequence $\langle m_{n0} \to L_0 \to m_{0(n-1)} \to A_{(n-1)0} \oplus A_{(n-2)(n-1)} \otimes A_{12} \rangle$ is followed with the robot waiting time $\bar{\omega}_i$, $i \in N_{n-1}$, being same as the one in the optimal periodic schedule. In this case, after $PM_n$ fails, by response policy 3 (RP3), the system can reach state $M_4$ with $M_4(PM_1)=M_4(PM_n)=0$, $M_4(PM_i)=1$, $i \in N_{n-1} \backslash \{1\}$, and $M_4(R)=0$. In this way, the hardware controller 300 is configured to control the robot to avoid loading a wafer into the failed PM ($PM_n$).

Case 4: $PM_{n-1}$ Failure with $n \ge 4$

A fourth response policy can be implemented by the hardware controller 300 if $PM_{n-1}$ failure with $n \ge 4$. After $PM_{n-1}$ fails, after the robot unloads a wafer from $PM_{n-1}$ with $G(x_{n-1})=1$, robot task sequence $\langle m_{(n-1)0} \to L_0 \to M_{0(n-2)} \to A_{(n-2)0} \oplus A_{(n-3)(n-2)} \otimes A_{12} \rangle$ is followed with the robot waiting time $\bar{\omega}_i$, $i \in N_{n-2}$, being same as the one in the optimal periodic schedule. In this case, after $PM_{n-1}$ fails, by response policy 4 (RP4), the system reaches state $M_5$ with $M_5(PM_1)=M_5(PM_{n-1})=M_5(PM_n)=0$, $M_5(PM_i)=1$, $i \in N_{n-2} \backslash \{1\}$, and $M_5(R)=0$. In this way, the controller 300 is configured to control the robot to avoid loading a wafer into the failed PM ($PM_{n-1}$). For Case 3, when $M_4$ is reached, the close-down process from $M_4$ to the end is also similar to the one in Case 1. Thus, by doing so just as for Case 1, an optimal and feasible close-down schedule can be found for Case 3. Similarly, an optimal and feasible close-down schedule can be found for Case 4.

Case 5: $PM_j$, $j \in N_{n-2} \backslash \{1, 2\}$, Failure with $n \ge 5$.

If the situation as defined by $PM_j$, $j \in N_{n-2} \backslash \{1, 2\}$, failure with $n \ge 5$ exists, then response policy 5 (RP5) is proposed to be used to determine a schedule. Response policies 1 to 4 are unsuitable for case 5. After $PM_j$, $j \in N_{n-2} \backslash \{1, 2\}$, fails, after the robot unloads a wafer from $PM_{n-1}$ with $G(x_{n-1})=1$, robot task sequence $\langle m_{j0} \to L_0 \to m_{0(j-1)} \to A_{(j-1)0} \oplus A_{(j-2)(j-1)} \otimes A_{12} \rangle$ is followed with the robot waiting time $\bar{\omega}_i$, $i \in N_{j-1}$, being same as the one in the optimal periodic schedule.

In this case, after the system responds to the PM failure by RP5, it reaches state $M_6$ with $M_6(PM_1)=M_6(PM_j)=M_6(PM_{j+1})=0$, $M_6(PM_i)=1$, $i \in N_n \backslash \{1, j, j+1\}$, and $M_6(R)=0$. At this state, the robot is at $PM_2$. By RP5, the hardware controller 300 is configured to control the robot to avoid loading a wafer into the failed PM in this case. Before $M_6$ is reached, a wafer is loaded into $PM_i$, $i \in N_n \backslash N_{j+1}$, by performing $y_i$. Then, if $i > j+2$, robot task sequence $\langle m_{i(i-2)} \to A_{(i-2)(i-1)} \otimes A_{(j+1)(j+2)} \to m_{(j+2)j} \to w_j \to U_j \rangle$ is performed, while if $i=j+2$, robot task sequence $\langle m_{(j+2)j} \to w_j \to U_j \rangle$ is performed. At this time $G(x_j)=1$. Then, by RP5, robot task sequence $\langle m_{j0} \to L_0 \to m_{0(j-1)} \to A_{(j-1)0} \oplus A_{(j-2)(j-1)} \otimes A_{12} \rangle$ is performed such that $M_6$ is reached. Therefore, before $M_6$ is reached, when $G(x_j)=1$ is performed, a wafer has been already loaded into $PM_i$, $i \in N_n \backslash N_{j+1}$. However, a wafer is loaded into $PM_i$, $i \in N_{j-1} \backslash \{1\}$, only after $G(x_j)=1$ is performed. Then, by RP5, if $2 < i < j$, robot task sequence $\langle m_{i(i-2)} \to A_{(i-2)(i-1)} \otimes A_{12} \rangle$ is performed such that $M_6$ is reached. If $i=2$, after $L_i$ is performed, the system reaches state $M_6$. At this time, the robot is at $PM_2$. Therefore, based on the above analysis, $\tau_2^6=0$ and $$\tau_i^6 = 2 \times (i-2) \times \mu + 2 \times (i-2) \times \alpha + \sum_{j=1}^{i-2} \varpi_j, \quad (3.16)$$

$$i \in N_n \backslash \{1, 2, j, j+1\}$$

After $M_6$ is reached, the backward strategy is still applied to operate the degraded tool. Therefore, there exists a "reduced" cluster tool called CT-RII with $n-3$ PMs, $n \ge 5$, i.e., it is formed by $PM_1$-$PM_{n-3}$. In this situation there are three (3) processing modules that are disabled or 3 processing modules that cannot be used. Among the three disabled processing modules, one of them is the processing module at Step 1 and the other two correspond to the failed processing module and the one adjacent to the failed processing module.

Assumed that CT-RII is at state $M_7$ with $M_7(PM_i)=1$, $i \in N_{n-3}$, $M_7(R)=0$, and the robot is at $PM_1$. At $M_7$, the wafer sojourn or residency time in $PM_i$, $i \in N_{n-3}$, is $\tau_i^7$. Then, with the backward strategy, in the following state evolution, it is required that when the wafers in $PM_i$, $i \in N_{j-2}$, complete all operations at $PM_1$-$PM_{j-2}$, they should be returned to the loadlocks, while when the wafers in $PM_i$, $i \in N_{n-3} \setminus N_{j-2}$, complete all the operations at $PM_{j-1}$-$PM_{n-3}$, they should be returned to the loadlocks. Let $PM_i$, $i \in N_{j-2}$, and $PM_i$, $i \in N_{n-3} \setminus N_{j-2}$, in CT-RII represent $PM_{i+1}$ and $PM_{i+3}$ in the original tool, respectively. Further, let $\tau_i^7 = \tau_{i+1}^6$, $i \in N_{j-2}$, and $\tau_i^7 = \tau_{i+3}^6$, $i \in N_{n-3} \setminus N_{j-2}$. Then, state $M_7$ of CT-RII is equivalent to $M_6$ for the original tool. Therefore, an optimal and feasible schedule for the close-down process from $M_7$ to the end for CT-RII can be converted into the one for the close-down process from $M_6$ to the end for the original cluster tool. For CT-RII let $g=n-3$ and $f=j-2$. Then, there are three situations that exist.

Situation 1:

$g-f \geq f \geq 1$. In this situation, let $M_7C_j$, $1 \leq j \leq f$, represent a state that is reached during the close-down process from $M_7$ to $M_7C_f$ such that $PM_j$ and $PM_{f+j}$ are emptied. If $f=1$, to transfer $M_7$ to $M_7C_f$, robot task sequence $\langle m_{1g} \to A_{g0} \oplus A_{(g-1)g} \otimes A_{(f+1)(f+2)} \to m_{(f+2)f} \to A_{f0} \rangle$ is performed. If $f=2$, to transfer $M_7$ to $M_7C_1$, $\langle m_{1g} \to A_{g0} \oplus A_{(g-1)g} \otimes A_{(f+1)(f+2)} \oplus A_{f0} \oplus A_{(f-1)f} \rangle$ is performed; to transfer $M_7C_1$ to $M_7C_f$, $\langle m_{2g} \to A_{g0} \oplus A_{(g-1)g} \otimes A_{(f+2)(f+3)} \oplus A_{f0} \rangle$ is performed. If $f \geq 3$, to transfer $M_7$ to $M_7C_1$, $\langle m_{1g} \to A_{g0} \oplus A_{(g-1)g} \otimes A_{(f+1)(f+2)} \oplus A_{f0} \oplus A_{(f-1)f} \otimes A_{12} \rangle$ is performed; to transfer $M_7C_i$ to $M_7C_{i+1}$, $1 \leq i \leq f-2$, $\langle m_{(i+1)g} \to A_{g0} \oplus A_{(g-1)g} \otimes A_{(f+i+1)(f+i+2)} \oplus A_{f0} \oplus A_{(f-1)f} \otimes A_{(i+1)(i+2)} \rangle$ is performed; to transfer $M_7C_{f-1}$ to $M_7C_f$, $\langle m_{fg} \to A_{g0} \oplus A_{(g-1)g} \otimes A_{(2f)(2f+1)} \oplus A_{f0} \rangle$ is performed.

Notice that, at $M_7C_f$, $M_7C_f(PM_i)=0$, $i \in N_{2f}$, $M_7C_f(PM_i)=1$, $i \in N_g \setminus N_{2f}$, $M_7C_f(R)=0$, and the robot is at the loadlocks. Then, if $g-2f=1$, it implies that there is only one wafer in the system at $M_7C_f$, i.e., there is a wafer in $PM_g$ only. Thus, by performing $\langle m_{0g} \to A_{g0} \rangle$, the close-down process of the tool ends. If $g-2f>1$, let $M_7C_{f+i}$, $j \geq 1$, represent a state that is reached during the close-down process from $M_7C_f$ to the final idle state such that $PM_{2f+j}$ is emptied and a wafer is just loaded into $PM_{2f+j+1}$. Then, to transfer $M_7C_f$ to $M_7C_{f+1}$, robot task sequence $\langle m_{0g} \to A_{g0} \oplus A_{(g-1)g} \otimes A_{(2f+1)(2f+2)} \rangle$ is performed, to transfer $M_7C_{f+i}$ to $M_7C_{f+i+1}$, $1 \leq i \leq g-2f-2$, $\langle m_{(i+2f+1)g} \to A_{g0} \oplus A_{(g-1)g} \otimes A_{(i+2f+1)(i+2f+2)} \rangle$ is performed. When $M_7C_{f+i}=g-(2f+1)$ and $i \geq 1$, is reached, there is a wafer in $PM_g$ only. At the same time, the robot is at $PM_g$ since the robot just loads a wafer into it. Then, $A_{g0}$ is performed such that the close-down process ends.

Figure 10:
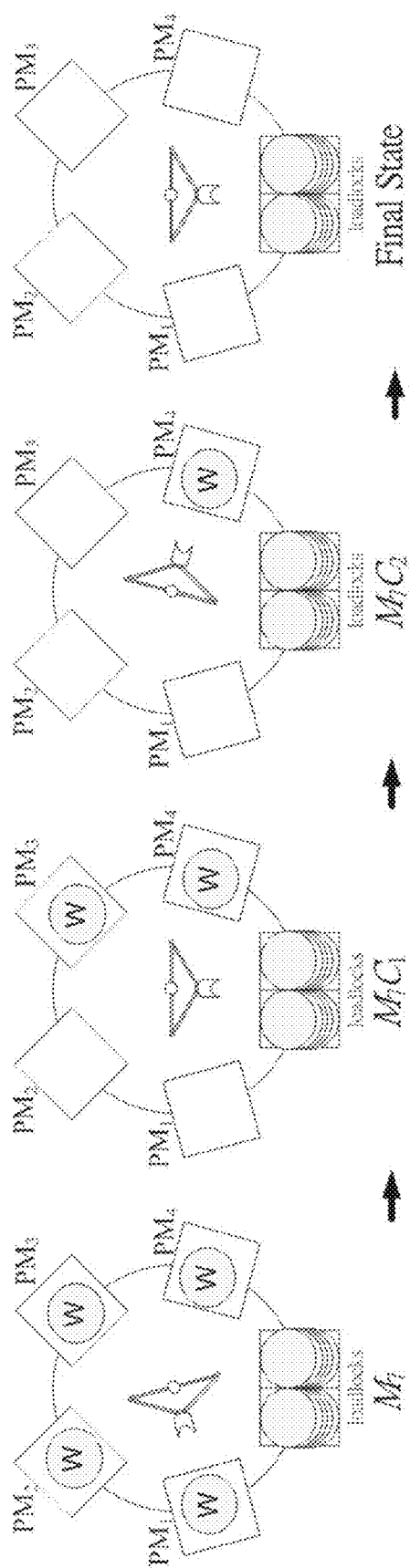
FIG. 10 is an example close down process for situation 1 when response policy 5 is implemented

FIG. 10 is an example with wafer flow pattern ($PM_1$, $PM_2$, $PM_3$, $PM_4$) to show the state evolution during the close-down process of CT-RII for Situation 1 when response policy 5 is used. FIG. 10 is an example close down process for situation 1 when response policy 5 is implemented. In this example, let $g=4$ and $f=1$. From $M_7$ to $M_7C_1$, both of wafers in $PM_4$ and $PM_1$ are delivered to the loadlocks, the wafer in $PM_3$ is delivered to $PM_4$, and the one in $PM_2$ is delivered to $PM_3$. From $M_7C_1$ to $M_7C_2$, the wafer in $PM_4$ is delivered to the loadlocks and the one in $PM_3$ is delivered to $PM_4$. Then, with the wafer in $PM_4$ being delivered to the loadlocks, the idle state of CT-RII is reached from $M_7C_2$.

Situation 2:

$f>g-f \geq 1$. In this situation, let $M_7C_j$, $1 \leq j \leq g-f$, represent a state that is reached during the close-down process from $M_7$ to $M_7C_{g-f}$ such that $PM_j$ and $PM_{f+j}$ are emptied. If $g-f=1$, to transfer $M_7$ to $M_7C_{g-f}$, robot task sequence $\langle m_{1g} \to A_{g0} \oplus A_{f0} \oplus A_{(f-1)f} \otimes A_{12} \rangle$ is performed. If $g-f=2$, to transfer $M_7$ to $M_7C_1$, $\langle m_{1g} \to A_{g0} \oplus A_{(g-1)g} \oplus A_{f0} \oplus A_{(f-1)f} \otimes A_{12} \rangle$ is performed; to transfer $M_7C_1$ to $M_7C_{g-f}$, $\langle m_{2g} \to A_{g0} \oplus A_{f0} \oplus A_{(f-1)f} \otimes A_{23} \rangle$ is performed.

If $g-f \geq 3$, to transfer $M_7$ to $M_7C_1$, $\langle m_{1g} \to A_{g0} \oplus A_{(g-1)g} \otimes A_{(f+1)(f+2)} \oplus A_{f0} \oplus A_{(f-1)f} \otimes A_{12} \rangle$ is performed; to transfer $M_7C_i$ to $M_7C_{i+1}$, $1 \leq i \leq g-f-2$, $\langle m_{(i+1)g} \to A_{g0} \oplus A_{(g-1)g} \otimes A_{(f+i+1)(f+i+2)} \oplus A_{f0} \oplus A_{(f-1)f} \otimes A_{(i+1)(i+2)} \rangle$ is performed; to transfer $M_7C_{g-f-1}$ to $M_6C_{g-f}$, $\langle m_{(g-f)g} \to A_{g0} \oplus A_{f0} \oplus A_{(f-1)f} \otimes A_{(g-f)(g-f+1)} \rangle$ is performed.

At $M_7C_{g-f}$, $M_7C_{g-f}(PM_i)=0$, $i \in N_g \setminus N_f$, $M_7C_{g-f}(PM_i)=0$, $i \in N_{g-f}$, $M_7C_{g-f}(PM_i)=1$, $i \in N_f \setminus N_{g-f}$, $M_7C_{g-f}(R)=0$, and the robot is at $PM_{g-f+1}$. Then, if $2f-g=1$, it implies that, at $M_7C_{g-f}$, there is a wafer in $PM_f$ only. Thus, by performing $A_{f0}$, the close-down process of the tool ends. If $2f-g>1$, let $M_7C_{g-f+j}$, $j \geq 1$, represent a state that is reached during the close-down process from $M_7C_{g-f}$ to the final idle state such that $PM_{g-f+j}$ is emptied and a wafer is just loaded into $PM_{g-f+j+1}$. Then, to transfer $M_7C_{g-f}$ to $M_7C_{g-f+1}$, robot task sequence $\langle m_{(g-f+1)f} \to A_{f0} \oplus A_{(f-1)f} \otimes A_{(g-f+1)(g-f+2)} \rangle$ is performed, to transfer $M_7C_{g-f+i}$ to $M_7C_{g-f+i+1}$, $1 \leq i \leq 2f-g-2$, $\langle m_{(i+g-f+1)f} \to A_{f0} \oplus A_{(f-1)f} \otimes A_{(i+g-f+1)(i+g-f+2)} \rangle$ is performed. When $M_7C_{g-f+i}$, $i=2f-g-1$ and $i \geq 1$, is reached, there is a wafer in $PM_f$ only and the robot is at $PM_f$ since the robot just loads a wafer into it. Then, $A_{f0}$ is performed such that the close-down process ends.

Figure 11:
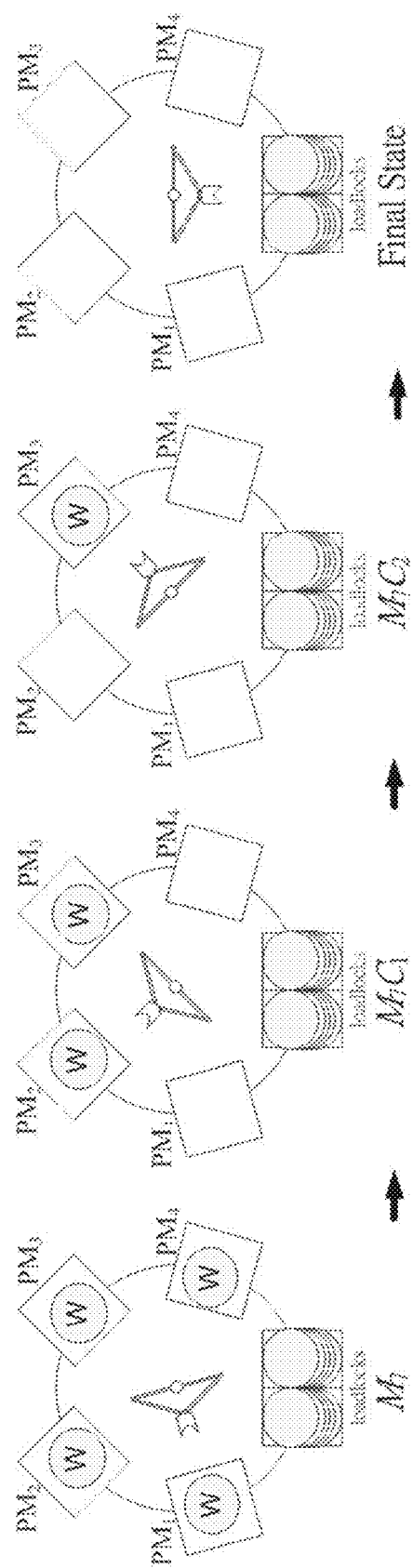
FIG. 11 is an example close down process for situation 2 when response policy 5 is implemented.

FIG. 11 shows an example to show the state evolution during the close down process of CT-RII for situation 2. FIG. 11 is an example close down process for situation 2 when response policy 5 is used. Assume that the wafer flow pattern is ($PM_1$, $PM_2$, $PM_3$, $PM_4$). Let $g=4$ and $f=3$. From $M_7$ to $M_7C_1$, both of wafers in $PM_4$ and $PM_3$ are delivered to the loadlocks, the wafer in $PM_2$ is delivered to $PM_3$, and the one in $PM_1$ is delivered to $PM_2$. From $M_7C_1$ to $M_7C_2$, the wafer in $PM_3$ is delivered to the loadlocks and the one in $PM_2$ is delivered to $PM_3$. Then, the idle state of CT-RII is reached from $M_7C_2$ by delivering the wafer in $PM_3$ to the loadlocks.

Situation 3:

$g-f=f \geq 1$. Similar to Situations 1 and 2, let $M_7C_j$, $1 \leq j \leq f = g-f$, represent a state that is reached during the close-down process from $M_7$ to $M_7C_f$ ($M_7C_{g-f}$) such that $PM_j$ and $PM_{f+j}$ are emptied. If $g-f=f=1$, to transfer $M_7$ to $M_7C_1$, robot task sequence $\langle m_{12} \to A_{20} \oplus A_{10} \rangle$ is performed. At this time, the system is idle. Therefore, the close-down process ends. If $g-f=f=2$, to transfer $M_7$ to $M_7C_1$, $\langle m_{14} \to A_{40} \oplus A_{34} \oplus A_{20} \oplus A_{12} \rangle$ is performed; to transfer $M_7C_1$ to $M_7C_2$, $\langle m_{24} \to A_{40} \oplus A_{20} \rangle$ is performed. At this time, the system is idle. Therefore, the close-down process ends. If $g-f=f \geq 3$, to transfer $M_7$ to $M_7C_1$, $\langle m_{1g} \to A_{g0} \oplus A_{(g-1)g} \otimes A_{(f+1)(f+2)} \oplus A_{f0} \oplus A_{(f-1)f} \otimes A_{12} \rangle$ is performed; to transfer $M_7C_i$ to $M_7C_{i+1}$, $1 \leq i \leq f-2$, $\langle m_{(i+1)g} \to A_{g0} \oplus A_{(g-1)g} \otimes A_{(f+i+1)(f+i+2)} \oplus A_{f0} \oplus A_{(f-1)f} \otimes A_{(i+1)(i+2)} \rangle$ is performed; to transfer $M_7C_{f-1}$ to $M_7C_f$, $\langle m_{fg} \to A_{g0} \oplus A_{f0} \rangle$ is performed. At this time, the system is idle. Therefore, the close-down process ends.

Figure 12:
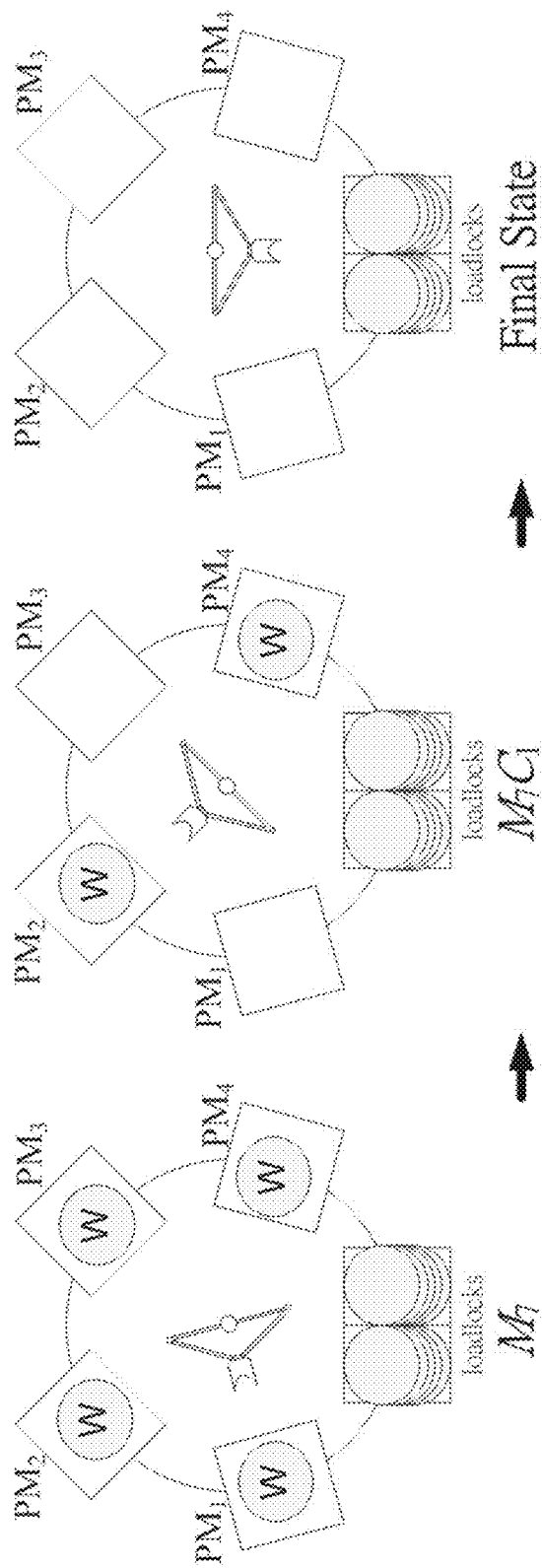
FIG. 12 shows an example of a failure close down process of situation 3 when response policy 5 is implemented.

FIG. 12 shows an example of a failure close down process of situation 3 in case 5. In FIG. 12 assume that the wafer flow pattern of CT-RII is ($PM_1$, $PM_2$, $PM_3$, $PM_4$). Let g=4 and f=2 such that g−f=f. Then, for Situation 3 in Case 5, the state evolution during the close-down process is shown in FIG. 12. From $M_7$ to $M_7C_1$, both of wafers in $PM_4$ and $PM_2$ are delivered to the loadlocks, the wafer in $PM_3$ is delivered to $PM_4$, and the one in $PM_1$ is delivered to $PM_2$. From $M_7C_1$ to $M_7C_2$, both of wafers in $PM_4$ and $PM_2$ are delivered to the loadlocks such that CT-RII is emptied.

The following third linear program (i.e. Linear program 3) is used to determine an optimal and feasible schedule for a failure close down process when a fifth response policy is used. The third linear program is used when at least three processing modules are disabled. Below is the linear program and an explanation thereof.

$$\text{Minimize } J = \begin{cases} y_g^{g-f}, & \text{if } g-f \geq f \\ y_{f\_0}^f, & \text{otherwise} \end{cases} \quad (3.17)$$

Subject to:

$$x_g^1 = \mu + \overline{\omega}_g^1 + \alpha \quad (3.18)$$

$$x_g^d = y_d^{d-1} + \mu + \overline{\omega}_g^d + \alpha, 2 \leq d \leq \min\{g-f, f\} \quad (3.19)$$

$$x_{g-1}^d = y_0^d + \mu + \overline{\omega}_{g-1}^d + \alpha, 1 \leq d \leq \min\{g-1-f, f\} \quad (3.20)$$

$$x_i^d = y_{i+2}^d + \mu + \omega_1^d + \alpha, f+1 \leq i \leq g-2, 1 \leq d \leq \min\{i-f, f\} \quad (3.21)$$

$$y_0^d = x_g^d + \mu + \alpha, 1 \leq d \leq \min\{g-f, f\} \quad (3.22)$$

$$y_i^d = x_{i-1}^d + \mu + \alpha, f+2 \leq i \leq g, 1 \leq d \leq \min\{i-1-f, f\} \quad (3.23)$$

$$x_f^d = y_{f-1+d}^d + \mu + \overline{\omega}_f^d + \alpha, 1 \leq d \leq \min\{g-f-1, f\} \quad (3.24)$$

$$x_f^d = y_0^d + \mu + \overline{\omega}_f^d + \alpha, d = g-f, \min\{g-f, f\} = g-f \quad (3.25)$$

$$x_{f-1}^d = y_{f\_0}^d + \mu + \overline{\omega}_{f-1}^d + \alpha, 1 \leq f-1, 1 \leq d \leq \min\{g-f, f-1\} \quad (3.26)$$

$$x_i^d = y_{i+2}^d + \mu + \overline{\omega}_1^d + \alpha, 1 \leq i \leq f-2, 1 \leq d \leq \min\{g-f, i\} \quad (3.27)$$

$$y_{f\_0}^d = x_f^d + \mu + \alpha, 1 \leq d \leq \min\{g-f, f\} \quad (3.28)$$

$$y_i^d = x_{i-1}^d + \mu + \alpha, 2 \leq i \leq f, 1 \leq d \leq \min\{g-f, i-1\} \quad (3.29)$$

$$\alpha_i \leq \tau_i^6 + x_i^1 - \alpha \leq \alpha_i + \delta_i, 1 \leq i \leq g \quad (3.30)$$

$$\alpha_i \leq x_i^d - y_i^{d-1} - \alpha \leq \alpha_i + \delta_i, 2 \leq i \leq f, 2 \leq d \leq \min\{g-f, f\}, d \leq i \quad (3.31)$$

$$\alpha_i \leq x_i^d - y_i^{d-1} - \alpha \leq \alpha_i + \delta_i, f+2 \leq i \leq g, 2 \leq d \leq \min\{g-f, f\}, d \leq i-f \quad (3.32)$$

Then, if g−f>f, then:

$$x_g^{f+1} = y_{f\_0}^f + \mu + \overline{\omega}_g^{f+1} + \alpha \quad (3.33)$$

$$x_g^d = y_{d+f}^{d-1} + \mu + \overline{\omega}_g^d + \alpha, f+2 \leq d \leq g-f-1 \quad (3.34)$$

$$x_g^{g-f} = y_g^{g-f-1} + \overline{\omega}_g^{g-f} + \alpha, g-2f > 1 \quad (3.35)$$

$$x_{g-1}^d = y_0^d + \mu + \overline{\omega}_{g-1}^d + \alpha, f+1 \leq d \leq g-f-1 \quad (3.36)$$

$$x_i^d = y_{i+2}^d + \mu + \overline{\omega}_1^d + \alpha, f+1 \leq d \leq i-f, 2f+2 \leq i \leq g-2 \quad (3.37)$$

$$y_0^d = x_g^d + \mu + \alpha, f+1 \leq d \leq g-f \quad (3.38)$$

$$y_i^d = x_{i-1}^d + \mu + \alpha, f+1 \leq d < i-f, 2f+2 \leq i \leq g \quad (3.39)$$

$$\alpha_i \leq x_i^d - y_i^{d-1} - \alpha \leq \alpha_i + \delta_i, f+1 \leq d \leq i-f, 2f+1 \leq i \leq g \quad (3.40)$$

if, f>g−f, then:

$$x_f^f = y_f^{f-1} + \overline{\omega}_f^f + \alpha \quad (3.41)$$

$$x_f^d = y_d^{d-1} + \mu + \overline{\omega}_f^d + \alpha, g-f+1 \leq d \leq f-1 \quad (3.42)$$

$$x_{f-1}^d = y_{f\_0}^d + \mu + \overline{\omega}_{f-1}^d + \alpha, g-f+1 \leq d \leq f-1 \quad (3.43)$$

$$x_i^d = y_{i+2}^d + \mu + \overline{\omega}_1^d + \alpha, g-f+1 \leq d \leq i \leq f-2 \quad (3.44)$$

$$y_{f\_0}^d = x_f^d + \mu + \alpha, g-f+1 \leq d \leq f \quad (3.45)$$

$$y_i^d = x_{i-1}^d + \mu + \alpha, g-f+1 \leq d < i \leq f \quad (3.46)$$

$$\alpha_i \leq x_i^d - y_i^{d-1} - \alpha \leq \alpha_i + \delta_i, g-f+1 \leq d \leq i \leq f \quad (3.47)$$

In LP3, $L_{f\_0}$ and $y_{f\_0}^d$ denote the robot task of loading a wafer that is unloaded from $PM_f$ into the loadlocks and the time point when the d-th execution of $L_{f\_0}$ is completed, respectively. Objective (3.17) minimizes the makespan for different situations. Constraints (3.18)-(3.21), (3.24)-(3.27), (3.33)-(3.37), and (3.41)-(3.44) represent the time to complete the robot task of unloading a wafer from a PM. Constraints (3.22), (3.23), (3.28), (3.29), (3.38), (3.39), (3.45), and (3.46) give the time to complete the robot task of loading a wafer into a PM or the loadlocks. Constraints (3.30)-(3.32), (3.40), and (3.47) guarantee that wafer residency time constraints are satisfied. Note that CT-RII is the system converted from the original tool i.e. when the cluster tool apparatus has no processing module failures and no fail signal is received by the hardware controller 300.

The linear programs 1, 2 and 3 comprise a plurality of conditions that are used depending on the number and designation of failed processing modules or the type of close down process that needs to be applied.

Figure 13:
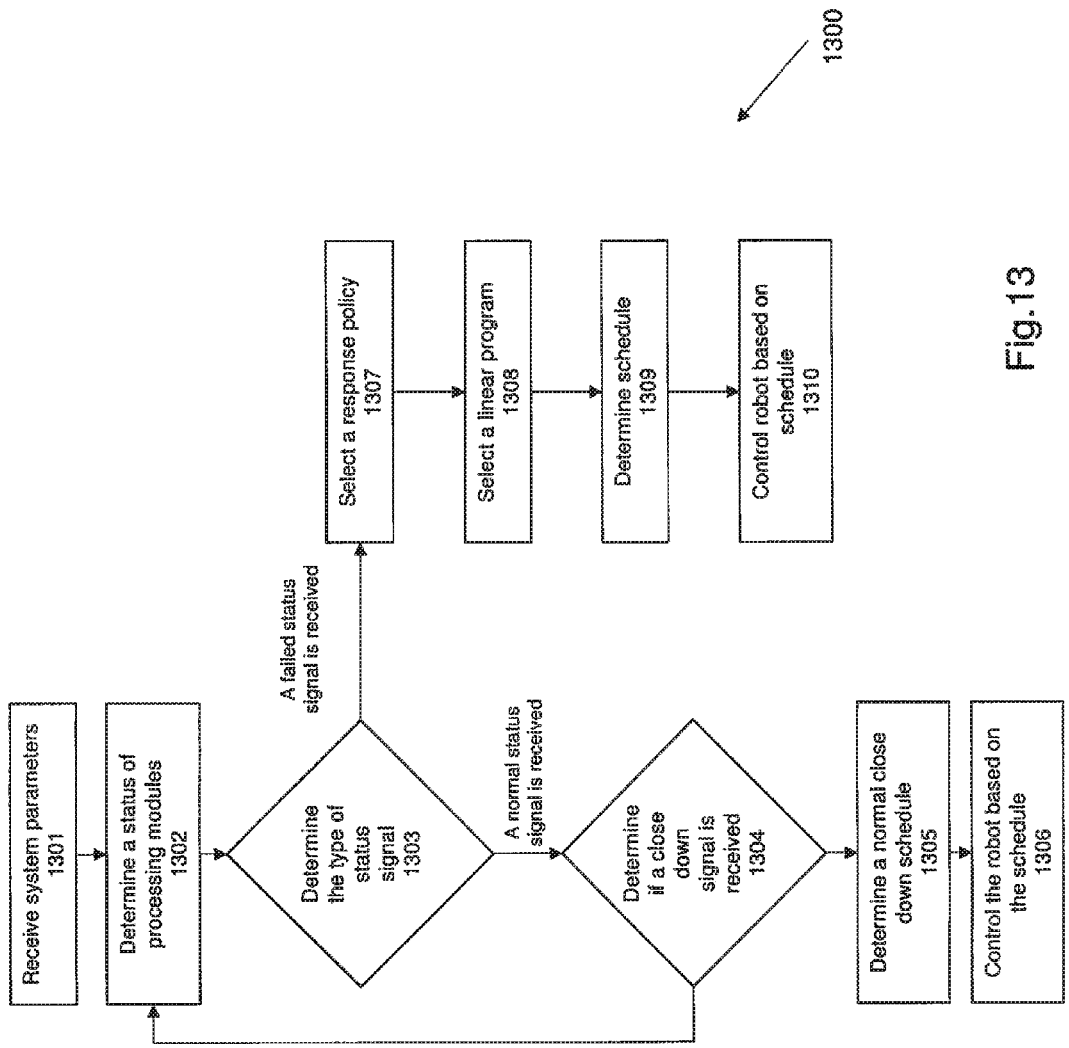
FIG. 13 shows an embodiment of a method 1300 of controlling a cluster tool apparatus to close down a cluster tool apparatus to an idle state.

FIG. 13 shows an embodiment of a method 1300 of controlling a cluster tool apparatus to close down a cluster tool apparatus to an idle state. The cluster tool apparatus comprises one or more processing modules, a robot and one or more loadlocks. The cluster tool apparatus comprises a hardware controller that is configured to execute the method to control at least the robot of the cluster tool apparatus. The method 1300 begins at step 1301. At step 1301 a plurality of system parameters are received. The parameters can be received by the controller through a user interface. The system parameters can be robot wafer loading time, robot wafer unloading times, wafer processing times, wafer residency times in a processing module, time for robot to move from one processing module to another.

The method 1300 proceeds to step 1302. At step 1302 the controller 300 is configured to determine a status of each of the processing modules. The status of the processing modules is determined based on a sensor signal. The status received from the sensor comprises a normal status signal or a failed status signal. At step 1303 the controller is configured to determine if a normal status signal is received or a failed status signal is received. If a normal status signal is received the method proceeds to step 1304. At step 1304 the method checks to see if a close down signal is received. The close down signal can be received from a user interface. The close down signal is received when a cluster tool apparatus is required to be shut down.

If a close down signal is received then at step 1305 the controller determines a schedule that corresponds to a normal close down process. The schedule is determined by solving LP1 (i.e. linear program 1). The linear program accounts for a wafer residency parameter such that the wafer residency parameter is not violated. The linear program 1 is advantageous because the close down process ensures that the wafer is not damaged by leaving it in a processing module for too long. At step 1306 the controller is configured to control the robot based on the determined schedule in step 1305 such that the robot performs a normal close down process. If no close down signal is received at step 1305 then the method returns to step 1302.

Returning to step 1303, if a failed status signal is received at step 1303, the method proceeds to step 1307. The failed status signal is provided by the sensor and is identified by the controller 300. Specifically the processor 302 proceeds the received sensor signals and identifies if the status is a normal status or a failed status based on the type of signal received. At step 1307 the controller is configured to select a response policy, from a plurality of predetermined response policies based on the number of total processing modules in the cluster tool apparatus and/or the specific processing module that has failed. The response policies are predefined and stored in the memory unit 304 of the controller 300. The method proceeds to step 1308 that comprises selecting a linear program corresponding to the selected response policy. At step 1309 a schedule is determined by solving the selected linear program, wherein the schedule corresponds to a failure close down process. At step 1310 the method comprises controlling the robot based on the schedule i.e. based on at least the determined robot waiting times to remove all wafers while avoiding placing wafers in the failed processing module and the adjacent processing modules. Step 1310 comprises executing a failure close down process to return the cluster tool apparatus 100 to an idle state. The method ends once the cluster tool apparatus is closed down.

The methods 1302 to 1304 are repeated while the cluster tool apparatus is in normal operation i.e. in a steady state. These methods are executed by the sensors and the controller constantly checks the sensor signals to determine the type of status signal received and determine a close down input has been received. The method 1300 is configured to be executed by the hardware controller 300 and its components. The method 1300 can be stored as computer readable and executable instructions in the memory unit 304. The memory unit 304 is a non transitory medium. The processor 302 is configured to execute the stored instructions and control the operation of the other controller components.

The normal close down process and the failure close down process are advantageous because they each provide an optimal method to close down the cluster too apparatus in response to either a close down signal or detecting the failure of a processing module. The schedule to control the robot for each situation is an optimal schedule that results in an optimal close down process.

The following is an example implementation of the described close down processes. In this example the wafer flow pattern for a single arm cluster tool is ($PM_1$, $PM_2$, $PM_3$, $PM_4$, $PM_5$, $PM_6$). The system parameters are=5s, $\alpha_0$=10s, $\mu$=2s, $\alpha_1$=90s, $\alpha_2$=115, $\alpha_3$=105, $\alpha_4$=$\alpha_5$=$\alpha_6$=100s, and $\delta_i$=20s, i∈$N_6$. These parameters relate to transitions as per table 400. An optimal and periodic schedule for steady state can be obtained by setting $\overline{\omega}_0$=$\overline{\omega}_i$=0s, i∈$N_5$, and $\overline{\omega}_6$=38s. Further, the cycle time of the system is 141s.

In this example when the cluster tool apparatus is required to stop, in response to a close down or shut down signal, LP1 (linear program 1) can be used to determine an optimal close down schedule. The close down process, based on the determined schedule, termed a normal close method takes 702s. In contrast a close down process implemented by using a virtual wafer method is called a conventional method. This conventional close down process takes 757s. The proposed normal method reduces the close down process time by 7.27%.

In this example it is assumed that the first processing module of the cluster tool apparatus i.e. $PM_1$ fails. It belongs to Case 1. When $PM_1$ fails, by RP1, the system reaches $M_1$. Before $M_1$ is reached, for CT-RI, an optimal and feasible schedule shown in Table 4.1 for the close-down process from $M_2$ to the end is obtained by LP2 within 1s. Note that $M_2$ of CT-RI is equivalent to $M_1$ of the original tool. Then, the close-down schedule for CT-RI can be converted into the one for the original cluster tool shown in Table 4.2. Thus, when $PM_1$ fails and $G(x_1)$=1, by RP1, the system reaches $M_1$ by performing $\langle m_{10} \rightarrow L_0 \rangle$. When $M_1$ is reached, with the obtained close-down schedule shown in Table 4.2, the original cluster tool is emptied in a fastest way. The time taken by $\langle m_{10} \rightarrow L_0 \rangle$ and the close-down process from $M_1$ to the end is 7s and 439s, respectively. Thus, the time taken by the close-down process from the time when $G(x_1)$=1 to the end is 446s. By using the conventional method, the close-down process takes 642s. If the normal close-down scheduling method is applied to the system, by using LP1 with minor revision, the close-down process takes 587s. In comparison with them, the time taken by the close-down process by using LP2 is reduced by 30.5% and 20%, respectively.

TABLE 4.1

A close-down schedule for CT-RI

| Variables: | $y_0^4$ | $x_4^1$ | $\overline{w}_4^1$ | $y_0^1$ | $x_3^1$ | $\overline{w}_3^1$ | $y_4^1$ | $x_2^1$ | $\overline{w}_2^1$ | $y_3^1$ |
|---|---|---|---|---|---|---|---|---|---|---|
| Solutions: | 439 | 49 | 42 | 56 | 63 | 0 | 70 | 77 | 0 | 84 |
| Variables: | $x_1^1$ | $\overline{w}_1^1$ | $y_2^1$ | $x_4^2$ | $\overline{w}_4^2$ | $y_0^2$ | $x_3^2$ | $\overline{w}_3^2$ | $y_4^2$ | $x_2^2$ |
| Solutions: | 96 | 5 | 103 | 180 | 70 | 187 | 194 | 0 | 201 | 208 |
| Variables: | $\overline{w}_2^2$ | $y_3^2$ | $x_4^3$ | $\overline{w}_4^3$ | $y_0^3$ | $x_3^3$ | $\overline{w}_3^3$ | $y_4^3$ | $x_4^4$ | $\overline{w}_4^4$ |
| Solutions: | 0 | 215 | 306 | 84 | 313 | 320 | 0 | 327 | 432 | 100 |

TABLE 4.2

A close-down schedule for the cluster tool with $PM_1$ being failed

| Variables: | $y_0^4$ | $x_6^1$ | $\overline{w}_6^1$ | $y_0^1$ | $x_5^1$ | $\overline{w}_5^1$ | $y_6^1$ | $x_4^1$ | $\overline{w}_4^1$ | $y_5^1$ |
|---|---|---|---|---|---|---|---|---|---|---|
| Solutions: | 439 | 49 | 42 | 56 | 63 | 0 | 70 | 77 | 0 | 84 |

TABLE 4.2-continued

A close-down schedule for the cluster tool with $PM_1$ being failed

| Variables: | $x_3^1$ | $\overline{w}_3^1$ | $y_4^1$ | $x_6^2$ | $\overline{w}_6^2$ | $y_0^2$ | $x_5^2$ | $\overline{w}_5^2$ | $y_6^2$ | $x_4^2$ |
|---|---|---|---|---|---|---|---|---|---|---|
| Solutions: | 96 | 5 | 103 | 180 | 70 | 187 | 194 | 0 | 201 | 208 |
| Variables: | $\overline{w}_4^2$ | $y_5^2$ | $x_6^3$ | $\overline{w}_6^3$ | $y_0^3$ | $x_5^3$ | $\overline{w}_5^3$ | $y_6^3$ | $x_6^4$ | $\overline{w}_6^4$ |
| Solutions: | 0 | 215 | 306 | 84 | 313 | 320 | 0 | 327 | 432 | 100 |

In the same example assume that processing module 3 fails i.e. assume if $PM_3$ fails, it belongs to Case 5. When $PM_3$ fails, by RP5, the system reaches $M_6$. Before $M_6$ is reached, for CT-RII, an optimal and feasible schedule for the close-down process from $M_7$ to the end is obtained by LP3 within 1s. This schedule is shown in Table 4.3. State $M_7$ of CT-RII is equivalent to $M_6$ of the original tool. The close-down schedule for CT-RII can be converted into the one for the original cluster tool shown in Table 4.4. Thus, when $PM_3$ fails and $G(x_3)=1$, by RP3, the system reaches $M_6$ by performing $\langle m_{30} \rightarrow L_0 \rightarrow m_{02} \rightarrow A_{20} \oplus A_{12} \rangle$. When $M_6$ is reached, with the obtained close-down schedule shown in Table 4.4, the original cluster tool is emptied in a fastest way. The time taken by $\langle m_{30} \rightarrow L_0 \rightarrow m_{02} \rightarrow A_{20} \oplus A_{12} \rangle$ and the close-down process from $M_6$ to the end is 35s and 182s, respectively. Hence, the time taken for the close-down process from the time when $G(x_3)=1$ is performed to the end is 217s. By using the conventional and normal close-down scheduling method, the close-down processes take 670s and 615s, respectively. Also, both of them damage two wafers. In comparison with them, the time taken for the close-down process by using LP3 is reduced by 67.6% and 64.7%, respectively. Besides, different from them, by using RP5 and LP3, two undamaged wafers are returned to the loadlocks after their second operation at $PM_2$ is completed, and thus successfully guard them without causing any quality problem to these two wafers.

TABLE 4.3

A close-down schedule for CT-II

| | Variables: | | | | | |
|---|---|---|---|---|---|---|
| | $y_0^2$ | $x_3^1$ | $\overline{\omega}_3^1$ | $y_0^1$ | $x_2^1$ | $\overline{\omega}_2^1$ |
| Solutions | 182 | 49 | 42 | 56 | 63 | 0 |
| | Variables | | | | | |
| | $y_3^1$ | $x_1^1$ | $\overline{\omega}_1^1$ | $y_{1\_0}^1$ | $x_3^2$ | $\overline{\omega}_3^2$ |
| Solutions: | 70 | 120 | 33 | 127 | 175 | 41 |

TABLE 4.4

A close-down schedule for the $PM_3$ failed cluster tool

| | Variables: | | | | | |
|---|---|---|---|---|---|---|
| | $y_0^2$ | $x_6^1$ | $\overline{\omega}_6^1$ | $y_0^1$ | $x_5^1$ | $\overline{\omega}_5^1$ |
| Solutions | 182 | 49 | 42 | 56 | 63 | 0 |
| | Variables: | | | | | |
| | $y_6^1$ | $x_2^1$ | $\overline{\omega}_2^1$ | $y_{2\_0}^1$ | $x_6^2$ | $\overline{\omega}_6^2$ |
| Solutions: | 70 | 120 | 33 | 127 | 175 | 41 |

The disclosed cluster tool apparatus, the cluster tool apparatus controller and the method for controlling the cluster tool apparatus are advantageous because various close down processes are contemplated for various conditions. Further an optimal schedule can be determined for a normal close down process or a failure close down process to control robot such that the close down process is minimized. The method of control and the cluster tool apparatus are advantageous because the status of each processing module is detected and based on a failure detection. Then, an appropriate schedule for an optimal close down process is determined and implemented. Further when a processing module is detected to have failed, the controller is configured to avoid placing a wafer in the damaged or failed processing module, thereby ensuring quality of the wafers is maintained. The method of controlling the cluster tool for a close down process is advantageous because the wafer residency time is met and accounted for in each schedule thereby reducing damage to any wafer and ensuring quality of the wafers.

It should be noted that in this disclosure the cluster tool may be referred to as a cluster tool apparatus or cluster tool system. The term apparatus and system are used interchangeably when describing the cluster tool and its operations.

It will be appreciated by persons skilled in the art that numerous variations and/or modifications may be made to the described cluster tool apparatus and method of controlling the cluster tool apparatus as shown in the specific embodiments without departing from the spirit or scope of the present disclosure. The present embodiments are, therefore, to be considered in all respects as illustrative and not restrictive.

The term "comprising" (and its grammatical variations) as used herein are used in the inclusive sense of "having" or "including" and not in the sense of "consisting only of"

It is to be understood that, if any prior art information is referred to herein, such reference does not constitute an admission that the information forms a part of the common general knowledge in the art, in Australia or any other country.

Although not required, the embodiments described with reference to the figures may be implemented as an Application Programming Interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present disclosure are either wholly implemented by computing system or partly implemented by computing systems then any appropriate computing system architecture may be utilised. This will include stand alone computers, network computers and dedicated hardware devices. Where the terms "computing system" and "computing device" are used, these terms are intended to cover any appropriate arrangement of computer hardware capable of implementing the function described.

The invention claimed is:

1. A cluster tool apparatus for processing a semiconductor product, comprising:
one or more processing modules located adjacent each other, each processing module being configured to process a semiconductor product,
one or more loadlocks configured to retain and dispense unprocessed semiconductor products, wherein the one or more loadlocks is positioned adjacent one of the one or more processing modules,
a robot configured to load, transfer and unload a semiconductor product to and from the one or more processing modules,
a hardware controller in electronic communication with the robot and configured to execute a method to control the cluster tool apparatus to close down the cluster tool apparatus to an idle state, the method to control the cluster tool apparatus comprising:
determining a status of each of the one or more processing modules,
determining if a close down process is required based on the determined status of the one or more processing modules or based on a close down signal,
determining a schedule for a close down process based on if a close down process is required, wherein the schedule is determined based on a semiconductor product residency parameter,
controlling operation of the robot based on the determined schedule such that the robot performs the close down process;
wherein the cluster tool apparatus further comprises one or more sensors, each of the one or more sensors is associated with or located on the one or more processing modules, each of the one or more sensor modules is in electronic communication with the hardware controller, and wherein each of the one or more sensors is configured to detect a status of the corresponding one or more processing modules; and
wherein the hardware controller is configured to determine a processing module that has failed based on processing the received status of each processing module, the hardware controller further being configured to select one of a plurality of response policies, wherein each response policy corresponds to the number of total processing modules in the cluster tool apparatus and the processing module that is determined as failed.

2. The cluster tool apparatus in accordance with claim 1, wherein the schedule for the close down process outputs at least a robot waiting time for each step of the close down process that minimizes the close down process time such that the cluster tool apparatus reaches an idle state as quickly as possible such that at least the semiconductor product residency parameter is not exceeded.

3. The cluster tool apparatus in accordance with claim 1, wherein the close down process comprises:
removing all semiconductor products from each of the one or more processing modules and returning each semiconductor product to one of the one or more loadlocks; and, stopping operation of each of the one or more processing modules.

4. The cluster tool apparatus in accordance with claim 1, wherein the cluster tool apparatus further comprises a user interface configured to receive inputs from a user and present information to the user, the user interface is in electronic communication with the hardware controller, the user interface receives a close down input from the user, the hardware controller receives a close down signal from the user interface, wherein the close down signal corresponds to the close down input, the hardware controller is configured to determine the schedule in response to receiving a close down signal, wherein the determined schedule corresponds to a normal close down process, and wherein the hardware controller is configured to control at least the robot based on the determined schedule such that the robot performs the normal close down process.

5. The cluster tool apparatus in accordance with claim 4, wherein the hardware controller is configured to determine a schedule that corresponds to the normal close down process by solving a first linear program, the first linear program accounting for a semiconductor product residency parameter.

6. The cluster tool apparatus in accordance with claim 1, wherein each of the one or more sensors transmits status of the processing modules at regular time intervals to the hardware controller, wherein the status comprises a normal status signal or a failed status signal, wherein the failed status signal is generated when any one of the sensors detects a failure in a corresponding one or more of the processing modules.

7. The cluster tool apparatus in accordance with claim 6, wherein the hardware controller is configured to determine the schedule in response to receiving a failed status signal, wherein the determined schedule corresponds to a failure close down process.

8. The cluster tool apparatus in accordance with claim 7, wherein the hardware controller is configured to control the robot based on the determined schedule that corresponds to the failure close down process, such that the robot is configured to avoid placing a semiconductor product within any one of the one or more processing modules that have experienced a failure as detected by the corresponding one or more sensors, and the hardware controller is further configured to avoid placing a semiconductor product within a processing module adjacent the one or more processing modules that have experienced a failure as detected by the corresponding one or more sensor; and wherein the failure is detected by the sensor associated with the processing module.

9. The cluster tool apparatus in accordance with claim 1, wherein the hardware controller is configured to select one of a first type policy or a second type response policy, wherein the first type response policy is used to determine a schedule for a close down process, such that two or three of the processing modules including the failed one are disabled while the other of the processing modules are sequentially linked together in the cluster tool apparatus; and wherein the second type response policy is used to determine a schedule such that three processing modules, including the failed one, are disabled, wherein the three processing modules include the failed processing module and the one adjacent to the failed processing module, and the processing modules, except the disabled processing modules, cannot be sequentially linked together.

10. The cluster tool apparatus in accordance with claim 1, wherein the hardware controller is configured to select one of a first, second, third or fourth response policy, and the hardware controller is used to determine a schedule for a close down process, such that two or three of the processing modules, including the failed one, are disabled, while the other of the processing modules are sequentially linked together in the cluster tool apparatus; or the hardware controller is configured to implement a fifth response policy, and the hardware controller is used to determine a schedule such that three processing modules, including the failed one, are disabled, wherein the three processing modules, include the failed processing module and the one adjacent to the failed processing module, and the processing modules, except the disabled processing modules, cannot be sequentially linked together.

11. The cluster tool apparatus in accordance with claim 10, wherein the hardware controller is configured to determine a schedule that corresponds to a failure close down process by solving a second linear program when the first, second, third or fourth response policy is used, wherein the second linear program utilizes at least a specified semiconductor product residency parameter.

12. The cluster tool apparatus in accordance with claim 10, wherein the hardware controller is further configured to determine a schedule that corresponds to a failure close down process by solving a third linear program when a fifth response policy is used and wherein the third linear program utilizes at least a specified semiconductor product residency parameter.

13. A method of controlling a cluster tool apparatus to close down the cluster tool apparatus to an idle state, the cluster tool apparatus comprising one or more processing modules, a robot and one or more loadlocks, the cluster tool apparatus being configured to process a semiconductor product, the method comprising the steps of:
   determining a status of each of the one or more processing modules,
   determining if a close down process is required based on the determined status of the one or more processing modules or based on a close down signal,
   determining a schedule for a close down process based on if a close down process is required, wherein the schedule is determined based on a semiconductor product residency parameter,
   controlling operation of the robot based on the determined schedule such that the robot performs the close down process;
   receiving a status of the one or more processing modules, wherein the status comprises a normal status signal or a failed status signal, wherein the failed status signal is generated when any one of the sensors detects a failure in a corresponding one or more of the processing modules,
   determining the schedule in response to receiving a failed status signal, wherein the determined schedule corresponds to a failure close down process,
   controlling the robot based on the determined schedule that corresponds to the failure close down process, such that the robot is configured to avoid placing a semiconductor product within any one or more of the processing modules that have experienced a failure as detected by the corresponding one or more sensors and controlling the robot to avoid placing a semiconductor product within a processing module adjacent the failed processing module,
   determining the processing module that has failed based on processing the received status of each processing module, the hardware controller further being configured to select one of five response policies, wherein each response policy corresponds to the number of total processing modules in the cluster tool apparatus and the processing module that has failed.

14. The method in accordance with claim 13, wherein the schedule for a close down process outputs at least a robot waiting time for each step of the close down process that minimizes the close down process time such that the cluster tool apparatus reaches an idle state as quickly as possible and such that the semiconductor residency parameter is not exceeded, and wherein the close down process comprises: removing all semiconductor products from each of the one or more processing modules and returning each semiconductor product to the one of the one or more loadlocks and stopping each of the one or more processing modules.

15. The method in accordance with claim 13, wherein the method further comprises receiving a close down input from the user and receiving a close down signal from the user interface wherein the close down signal corresponds to the close down input, determining the schedule in response to receiving a close down signal, wherein the determined schedule corresponds to the normal close down process, determining a schedule that corresponds to a normal close down process by solving a first linear program, the first linear program accounting for a semiconductor product residency parameter, and controlling the robot based on the determined schedule such that the robot performs the normal close down process.

16. A method of controlling a cluster tool apparatus to close down the cluster tool apparatus to an idle state, the cluster tool apparatus comprising one or more processing modules, a robot, and one or more loadlocks, the cluster tool apparatus being configured to process a semiconductor product, the method comprising the steps of:
   determining a status of each of the one or more processing modules,
   determining if a close down process is required based on the determined status of the one or more processing module or based on a close down signal,
   determining a schedule for a close down process based on if a close down process is required, wherein the schedule is determined based on a semiconductor product residency parameter,
   controlling operation of the robot based on the determined schedule such that the robot performs the close down process,
   selecting one of a first type response policy and a second type response policy, wherein the first type response policy is used to determine a schedule for a close down process, such that two or three processing modules, including the failed one, are disabled while the other processing modules are sequentially linked together in the cluster tool apparatus; and wherein the second type response policy is used to determine a schedule such that three processing modules, including the failed one, are disabled, wherein the three processing modules include the failed processing module and the one adjacent to the failed processing module, and the processing modules, except the disabled processing modules, cannot be sequentially linked together.

17. A method of controlling a cluster tool apparatus to close down the cluster tool apparatus to an idle state, the cluster tool apparatus comprising one or more processing modules, a robot, and one or more loadlocks, the cluster tool apparatus being configured to process a semiconductor product, the method comprising the step of:
   determining a status of each of the one or more processing modules, determining if a close down process is required based on the determined status of the one or more processing modules or based on a closed down signal, determining a schedule for a close down process based on if a close down process is required, wherein the schedule is determined based on a semiconductor product residency parameter, and controlling operation of the robot based on the determined schedule such that the robot performs the close down process, determining a schedule that corresponds to a failure close down process by:
- solving a second linear program when a first, second, third or fourth response policy is used wherein the second linear program utilizes at least a specified semiconductor product residency parameter, or
- solving a third linear program when a fifth response policy is used, wherein the third linear program utilizes at least a specified semiconductor product residency parameter.

* * * * *